(12) United States Patent
Zheng et al.

(10) Patent No.: US 10,826,434 B2
(45) Date of Patent: Nov. 3, 2020

(54) RADIO FREQUENCY POWER AMPLIFIER WITH ADJUSTABLE POWER SUPPLY

(71) Applicant: Coolstar Technology, Inc., Santa Clara, CA (US)

(72) Inventors: Yi Zheng, Sunnyvale, CA (US); Xiaotong Lin, Saratoga, CA (US)

(73) Assignee: COOLSTAR TECHNOLOGY, INC., Santa Clara, CA (US)

( * ) Notice: Subject to any disclaimer, the term of this patent is extended or adjusted under 35 U.S.C. 154(b) by 7 days.

(21) Appl. No.: 16/373,172

(22) Filed: Apr. 2, 2019

(65) Prior Publication Data

US 2020/0321916 A1 Oct. 8, 2020

(51) Int. Cl.
*H03F 3/04* (2006.01)
*H03F 1/02* (2006.01)
(Continued)

(52) U.S. Cl.
CPC .......... *H03F 1/0211* (2013.01); *H01L 23/528* (2013.01); *H01L 23/5228* (2013.01);
(Continued)

(58) Field of Classification Search
CPC .. H03F 1/0211; H03F 3/245; H03F 2200/451; H03F 1/0244; H03F 2200/504;
(Continued)

(56) References Cited

U.S. PATENT DOCUMENTS

| 4,338,590 A | 7/1982 | Connolly, Jr. et al. |
| 5,242,855 A | 9/1993 | Oguro |

(Continued)

FOREIGN PATENT DOCUMENTS

CN 205195665 U 4/2016

OTHER PUBLICATIONS

Coherent, "The Digital Display Revolution: Built on Excimer Laser Annealing", 4 pages, www.Coherent.com.
(Continued)

*Primary Examiner* — Khanh V Nguyen
(74) *Attorney, Agent, or Firm* — Hoffmann & Baron, LLP

(57) ABSTRACT

A semiconductor device includes at least one RF power amplifier (RFPA) and a voltage supply adjustment network coupled with the RFPA for providing an internal supply voltage to the RFPA based on an applied input voltage. The voltage supply adjustment network includes multiple resistors, multiple Zener diodes, a voltage return connection, an internal supply voltage connection coupled with the RFPA for conveying the supply voltage to the RFPA, an input voltage connection adapted to receive the input voltage, and a configurable connection network coupled with the resistors and Zener diodes. A subset of the resistors and Zener diodes are selectively connected together between the input voltage and the voltage return connections via corresponding conductive links to provide a prescribed output voltage to the internal supply voltage connection as a function of the applied input voltage. The connection network is configured by applying an energy source to a selected conductive link(s) in the connection network.

17 Claims, 15 Drawing Sheets

(51) Int. Cl.
*H03F 3/24* (2006.01)
*H01L 23/525* (2006.01)
*H01L 29/866* (2006.01)
*H01L 23/528* (2006.01)
*H01L 23/522* (2006.01)

(52) U.S. Cl.
CPC ........ *H01L 23/5258* (2013.01); *H01L 29/866* (2013.01); *H03F 3/245* (2013.01); *H03F 1/0244* (2013.01); *H03F 2200/451* (2013.01)

(58) Field of Classification Search
CPC .......... H03F 1/0227; H03F 1/305; H03F 3/04; H03F 2200/507; H01L 23/5228; H01L 23/528; H01L 23/5258; H01L 29/866; H03G 3/004; H03G 3/3042
USPC .................................................. 330/127, 297
See application file for complete search history.

(56) References Cited

U.S. PATENT DOCUMENTS

| | | |
|---|---|---|
| 6,906,574 B2 | 6/2005 | Ohi et al. |
| 6,990,323 B2 | 1/2006 | Prikhodko et al. |
| 7,683,718 B2 | 3/2010 | Dishop |
| 8,717,101 B2 | 5/2014 | Li et al. |
| 2013/0033328 A1* | 2/2013 | Jones .................... H03F 1/0255 330/297 |
| 2018/0131334 A1 | 5/2018 | Teeter et al. |

OTHER PUBLICATIONS

Sameshima et al., "XeCl Excimer Laser Annealing Used to Fabricate Poly-Si TFT's", Japanese Journal of Applied Physics, vol. 28, No. 10, pp. 1789-1793; Oct. 1989.

International Search Report and Written Opinion of corresponding PCT Application No. PCT/US19/25405, pp. 1-8 (dated Jul. 12, 2019).

* cited by examiner

| $V_{SYSTEM}$ (V) | VDD (V) | LOAD POWER (W) | ZENER SELECTION (V) | R (OHM) | POWER EFFICIENCY |
|---|---|---|---|---|---|
| 20 | 18 | 3.5 | 18 | 10.3 | 90% |
| 20 | 15 | 3.5 | 15 | 20.8 | 75% |
| 19 | 15 | 3.5 | 15 | 17.1 | 79% |
| 19 | 15 | 1 | 15 | 60 | 79% |
| 15 | 12 | 3.5 | 12 | 10 | 80% |
| 15 | 12 | 1 | 12 | 36 | 80% |
| 12 | 12 | any | none | 0 | 100% |
| 12 | 10 | 3.5 | 10 | 5.6 | 83% |
| 12 | 10 | 1 | 10 | 20 | 83% |
| 10 | 10 | any | none | 0 | 100% |
| 8 | 8 | any | none | 0 | 100% |

FIG. 15

RADIO FREQUENCY POWER AMPLIFIER WITH ADJUSTABLE POWER SUPPLY

FIELD

The present invention relates generally to the electrical, electronic and computer arts, and, more particularly, to radio frequency (RF) power amplifiers.

BACKGROUND

An RF power amplifier (RFPA) is a type of electronic amplifier adapted to receive, as an input, a low-power RF signal and to generate, as an output, a higher power signal. One common application for an RFPA is driving the antenna of a transmitter. RFPA design objectives often include maximizing certain performance parameters such as, for example, gain, power output, bandwidth, power efficiency and linearity (low signal compression at rated output). Most of these performance parameters are affected, to at least some extent, by the supply voltage or drain voltage, VDD, of the RFPA output transistor.

The supply voltage available to the RFPA is typically determined by the individual system design or printed circuit board (PCB) design, which can vary widely depending upon the particular application in which the RFPA is being used. Since the RFPA is generally designed to operate within a narrow range of supply voltages in order to meet prescribed performance criteria, an external direct current (DC)-to-DC (DC-DC) voltage converter is often employed on the PCB to convert the wide variety of available external system voltages to a supply voltage level suitable for use by the RFPA.

DC-DC converters typically use switching techniques, such as in a switched-mode DC-DC converter architecture, to convert an input DC voltage level to an output DC voltage, which may be higher or lower, by storing the input energy temporarily and then releasing that energy to the output at a different voltage level. This energy storage mechanism may be implemented by either magnetic field storage elements (e.g., inductors, transformers, etc.) or electric field storage elements (e.g., capacitors) to increase or decrease the output voltage generated by the DC-DC converter. Switching conversion is more power efficient (often about 75 to 95 percent) compared to linear voltage regulation (e.g., resistor dividers, etc.), which dissipates unwanted power as heat. Nevertheless, a DC-DC converter exhibits a measurable power loss in the system.

A switched-mode DC-DC voltage converter typically includes a controller, switching transistors (e.g., metal-oxide-semiconductor field-effect transistors (MOSFETs)), input capacitor, output capacitor and output inductor. Unfortunately, these components require significant space on the PCB, which also adds cost. Hence, use of a DC-DC voltage converter in an RFPA circuit or system adds significant cost and complexity to the overall circuit design, increases the required space of the RFPA circuit and increases power consumption, all of which are undesirable.

SUMMARY

One or more embodiments of the present invention provide a highly efficient, high-speed RF power amplifier (RFPA) adapted for use with a variety of system voltage supply levels without the need for an external DC-DC voltage converter. Aspects according to some embodiments of the invention provide an RFPA circuit including an integrated voltage supply adjustment network comprised of Zener diodes and resistors which can be selectively connected to provide a desired internal voltage supply level as a function of the available system supply voltage, among other factors.

An exemplary semiconductor device according to an embodiment of the present invention includes at least one RFPA circuit and a voltage supply adjustment network coupled with the RFPA circuit for providing an internal supply voltage to the RFPA circuit based on an input voltage applied to the device. The voltage supply adjustment network includes multiple resistors, multiple Zener diodes, a voltage return connection, an internal supply voltage connection coupled with the RFPA circuit for conveying the supply voltage to the RFPA circuit, an input voltage connection adapted to receive the input voltage, and a configurable connection network coupled with the resistors and Zener diodes. A subset of the resistors and Zener diodes is selectively connected together between the input voltage and the voltage return connections via corresponding conductive links to provide a prescribed output voltage to the internal supply voltage connection as a function of the applied input voltage. The connection network is configured by application of an energy source to one or more selected conductive links in the connection network.

As may be used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Various units, circuits, modules, or other components may be described herein as being "configured to" perform a particular task or tasks. In such contexts, the term "configured to" is intended to be construed broadly as a recitation of structure generally meaning "having circuitry that" performs the task or tasks during operation. As such, the unit/circuit/module/component can be configured to perform the subject task or tasks even when the unit/circuit/module/component/is not currently powered on. In general, circuitry that forms the structure corresponding to "configured to" may include hardware circuits and/or memory storing program instructions executable to implement the operation. Similarly, various units/circuits/modules/components may be described as performing a task or tasks, for convenience in the description. Such descriptions should be interpreted as including the phrase "configured to." Reciting a unit/circuit/module/component that is configured to perform one or more tasks is expressly intended not to invoke a 35 U.S.C. § 112, paragraph (f) interpretation for that unit/circuit/module/component.

Techniques according to embodiments of the present invention provide substantial beneficial technical effects. By way of example only and without limitation, one or more embodiments of the invention achieve one or more of the following, among other benefits:

- provides a monolithic integrated circuit interface on a silicon substrate for accepting arbitrary system supply voltages;
- eliminates the need for a DC-DC converter and associated components and controller between a system power supply and an RFPA;

provides an integral adjustable supply voltage and precise bias tuning with fabrication processes that are compatible with standard front-end-of-line (FEOL) and back-end-of-line (BEOL) complementary metal-oxide-semiconductor (CMOS) processing, thus allowing performance enhancement and lower processing cost;

achieves a small form factor, which is advantageous in space-constrained applications where the system PCB space can be limited to accommodate a DC-DC converter and associated passive components;

eliminates energy loss caused by the DC-DC converter, thereby achieving better overall system efficiency;

provides an RFPA that is operable with a wide range of available system supply voltages, which allows greater flexibility in the system design without the need for replacing the RFPA or DC-DC converter.

These and other features and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 15 is a table showing exemplary combinations of resistors and Zener diodes in the selection circuitry of the semiconductor device for achieving certain internal supply voltage levels as a function of different external system supply voltages, according to one or more embodiments of the present invention.

Figure 1A:
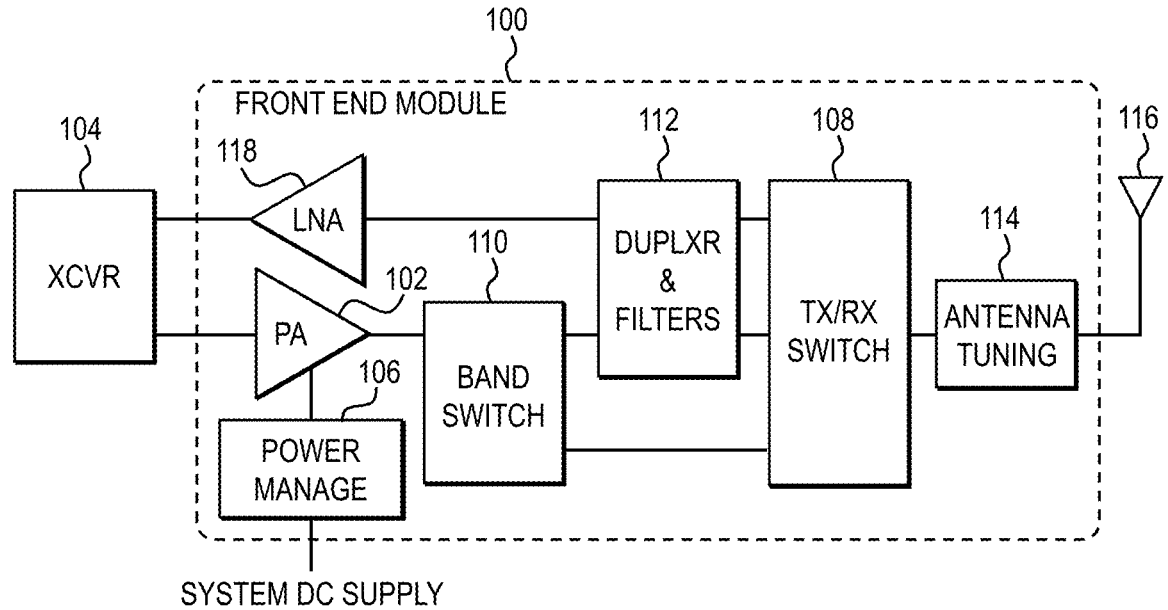
FIG. 1A is a block diagram depicting an exemplary standard RF front end module employing a DC-DC converter.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF PREFERRED EMBODIMENTS

Principles of the present invention will be described herein in the context of illustrative semiconductor structures including an RF power amplifier (RFPA) circuit having an integrated adjustable voltage supply. Embodiments of the invention provide a highly efficient, high-speed RFPA circuit adapted for use with arbitrary system voltage supply levels without the need for a DC-DC voltage converter. In one or more illustrative embodiments, the RFPA circuit includes an integrated voltage supply adjustment network comprised of Zener diodes and resistors which can be selectively connected in various configurations to provide a desired internal voltage supply level as a function of the available system supply voltage, among other factors, with power efficiency matching or surpassing that of a switch mode buck or boost DC-DC converter.

It is to be appreciated, however, that the invention is not limited to the specific devices, circuits, systems and/or methods illustratively shown and described herein. Rather, aspects of the present disclosure relate more broadly to techniques for highly efficient, high-speed signal amplification without the need for an external DC-DC voltage converter, thereby providing an easily integrated RFPA solution. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

Although the overall semiconductor structures described herein as well as the methods for fabricating such structures are entirely novel, certain individual processing steps required to implement a portion or portions of the technique (s) according to one or more embodiments of the invention may utilize conventional semiconductor fabrication techniques and conventional semiconductor fabrication tooling. These techniques and tooling will already be familiar to one having ordinary skill in the relevant arts. Moreover, many of the processing steps and tooling used to fabricate semiconductor devices are also described in a number of readily available publications, including, for example: P. H. Holloway et al., *Handbook of Compound Semiconductors: Growth, Processing, Characterization, and Devices*, Cambridge University Press, 2008; and R. K. Willardson et al., *Processing and Properties of Compound Semiconductors*, Academic Press, 2001, which are hereby incorporated by reference herein. It is emphasized that while some individual processing steps are set forth herein, those steps are merely illustrative and one skilled in the art may be familiar with several equally suitable alternatives that would also fall within the scope of the present invention.

It is to be understood that the various layers and/or regions shown in the accompanying figures are not necessarily drawn to scale. Furthermore, one or more semiconductor layers of a type commonly used in such integrated circuit devices may not be explicitly shown in a given figure for economy of description and clarity. This does not imply, however, that the semiconductor layer(s) not explicitly shown are omitted in the actual integrated circuit device.

FIG. 1A is a block diagram depicting an exemplary standard RF front end module (FEM) 100 including an RFPA connected in a transmit signal path of the FEM. The RF front end is generally defined as everything between the antenna and the digital baseband system. The FEM 100 includes an RFPA 102 having an input coupled with a transceiver 104, either directly or through an impedance matching network (not explicitly shown), and being adapted to receive a transmit input signal (TX IN). A power management module 106, which includes a DC-DC converter and associated circuitry, converts an external DC system supply to a suitable supply voltage for powering the RFPA 102. An amplified output signal generated by the RFPA 102 is supplied to a transmit/receive (TX/RX) switch 108, either directly or via a band switching module 110 and/or a duplexers and filters module 112. An output of the TX/RX switch 108 is fed to an antenna tuning module 114 and then supplied to an antenna 116 for transmission of the amplified output signal.

A receive signal path in the RF FEM 100 includes the antenna 116 and antenna tuning module 114, the TX/RX switch 108 and duplexers and filters module 112. An output of the duplexers and filters module 112 is supplied to an input of a low noise amplifier (LNA) 118 which is adapted to amplify the received signal before presenting it to the transceiver 104. This arrangement allows certain elements of the FEM to be shared by both the transmit and receive signal paths, such as the duplexers and filters module 112 and antenna 116. Aspects of the present invention focus primarily on the RFPA in the transmit signal path, and therefore specific details regarding the receive signal path and the functional components associated therewith will not be discussed further herein.

As previously stated, RFPA design objectives often seek to optimize certain operational parameters including, for example, gain, power output, bandwidth, power efficiency and linearity. Many of these parameters, including linearity, are affected to at least some extent by the supply voltage of the RFPA. Conventionally, the supply voltage available to the RFPA is determined by the individual system design or PCB design, which can vary widely depending upon the particular application in which the RFPA is being used. Since the RFPA is generally designed to operate within a narrow range of supply voltages in order to meet prescribed performance criteria, an external DC-DC voltage converter, as utilized in the power management module 106 shown in FIG. 1A, is employed on the PCB to convert the wide variety of available external system voltages to a supply voltage level suitable for use by the RFPA. Use of a DC-DC converter, however, imparts significant disadvantages on the FEM, some of which were previously stated herein.

Since the RFPA should ideally be suitable for use in conjunction with a wide variety of system voltage supply levels, without substantially impacting prescribed performance criteria and without compromising reliability, one or more embodiments of the invention provide an RFPA circuit that beneficially includes an integrated voltage adjustment network to selectively control an internal supply voltage of the RFPA circuit as a function of the system voltage supply level as well as certain other parameters affected by semiconductor processing variations (e.g., device threshold voltage, resistance values, etc.). In this manner, the RFPA circuit according to one or more embodiments of the invention advantageously eliminates the need for a DC-DC converter and corresponding components (e.g., power management module 106 in FIG. 1A), thereby enabling the system DC supply to be connected directly to the RFPA, as shown in FIG. 1B.

Figure 1B:
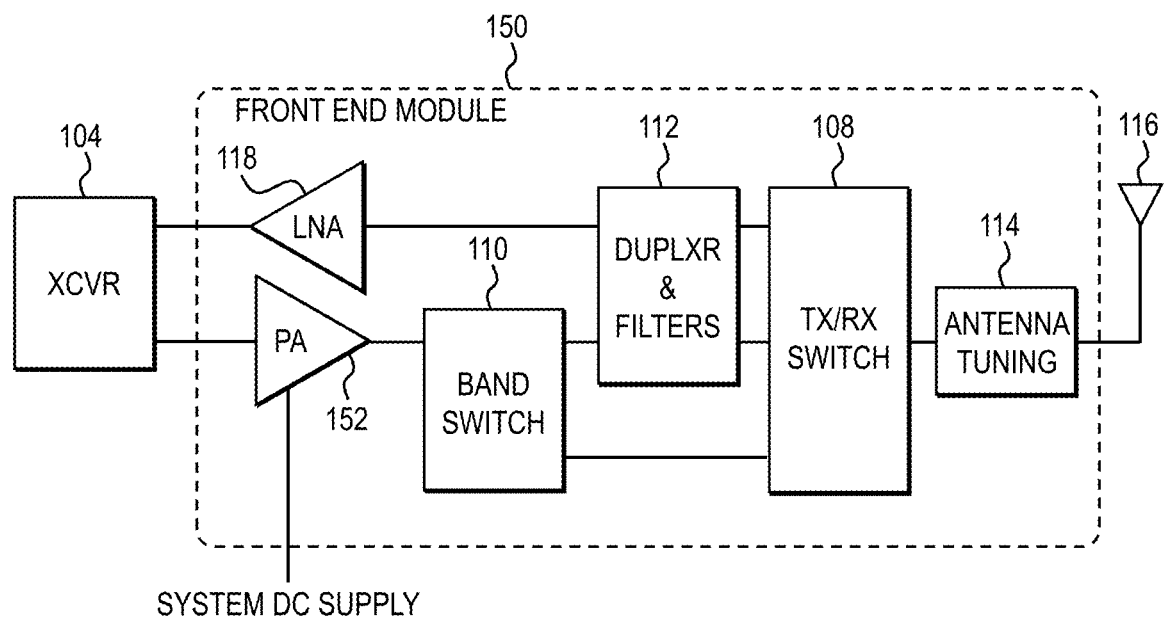
FIG. 1B is a block diagram depicting at least a portion of an exemplary RF front end module, according to an embodiment of the present invention.

Specifically, FIG. 1B is a block diagram depicting at least a portion of an exemplary RF front end module (FEM) 150, according to an embodiment of the present invention. The FEM 150 is similar to the FEM 100 shown in FIG. 1A, except that the FEM 150 includes an RFPA circuit 152 having an integrated voltage adjustment network to selectively control an internal supply voltage of the RFPA circuit. This allows the system DC supply to be connected directly to the RFPA 152 without the need for external voltage conversion circuitry.

A Zener diode can be used to supply a stable DC voltage as a function of a variable DC voltage applied to the Zener diode. Zener diode-based voltage regulation generally has poor power efficiency. In a basic configuration, power delivered by a voltage source, $V_S$, is distributed to three devices: a load, $R_L$; a Zener diode; and a shunt resistor, R. Power efficiency, defined as a ratio of load power, $P_L$, to input power, $P_I$, is dependent on the respective values of R, $R_L$, $V_S$ and $V_Z$, where $V_Z$ is defined as the Zener voltage. Peak efficiency occurs when the regulator efficiency equals $V_Z/V_S$. This implies that in order to increase regulator efficiency, $V_S$ should be made as small as possible. However, lower $V_S$ reduces the maximum possible load power, $P_{L,max}$. Therefore, optimal values of R and $V_Z$ will vary depending on the conditions of load resistance and source voltage, $R_L$ and $V_S$, respectively. The load $R_L$ is generally determined by the design of the RFPA circuitry, which leaves $V_S$ as a key control parameter, since it is determined by the system design in the final application, where it may vary widely, for example from 9 to 20 volts. Accordingly, one or more embodiments of the invention control $R_L$ and $V_Z$ to fit different system supply voltages $V_S$, beneficially allowing the RFPA circuitry to maintain a prescribed energy efficiency.

Another aspect that embodiments of the invention address relates to an inevitable variation from chip to chip in one or more important device parameters, such as, but not limited to, device threshold voltage and resistor values. Modern CMOS fabrication technology provides sophisticated control over many process parameters. However, even with this kind of accurate control, process-induced variations are typically still too large to meet biasing control constraints for an RFPA used, for instance, in a Wi-Fi application, which imposes stringent requirements on linearity and dynamic error vector magnitude (EVM) signal distortion, among other RFPA performance criteria. This process-induced variation is attributable, at least in part, to changes in MOSFET threshold voltage, Zener diode reverse breakdown voltage and resistor values, among other factors.

For example, MOSFET threshold voltage of one chip may vary from another chip of the same design but at a different location on the same wafer caused primarily by wafer processing variations, such as micro-loading effects. By way of illustration only and without limitation, during a gate etch process step by plasma etch using chlorine gas chemistry, the local chlorine concentration and plasma density changes according to gate array pattern density. As a result, the etch rate, and thus the final gate length, will vary from denser to sparser areas of the chip. Likewise, a commonly used polysilicon resistor typically exhibits a resistance variation in a range of about ±ten percent (10%) after processing. This is due, at least in part, to a variation in dopant implant concentration and diffusion of dopants after multiple thermal processing steps. The resistor pattern and area can also vary as a result of etch processing, as the resistance value of a thin film layer is determined primarily by a square shape (i.e., square value). Accordingly, embodiments of the invention provide a mechanism for controlling a gate bias value as desired on each individual chip according to the particular threshold voltage, gate resistance and actual resistor values. This accomplished, in one or more embodiments, through selection circuitry, integrated monolithically with the RFPA, which includes a configurable resistor network connected to the external system DC voltage supply, and involves fine tuning the resistor network to achieve a desired gate voltage for optimal RFPA performance.

Figure 2A:
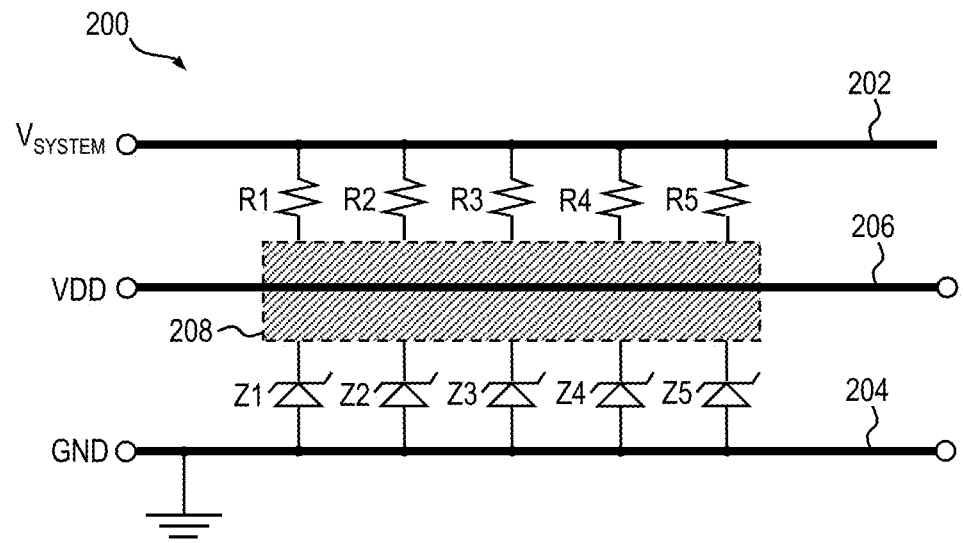
FIGS. 2A and 2B are schematic diagrams conceptually depicting at least a portion of exemplary selection circuitry in a semiconductor device for adjusting an internal supply voltage of the device to meet prescribed operating parameters based on an applied external system voltage source, before and after the adjustment process, respectively, according to an embodiment of the present invention.
Figure 2B:
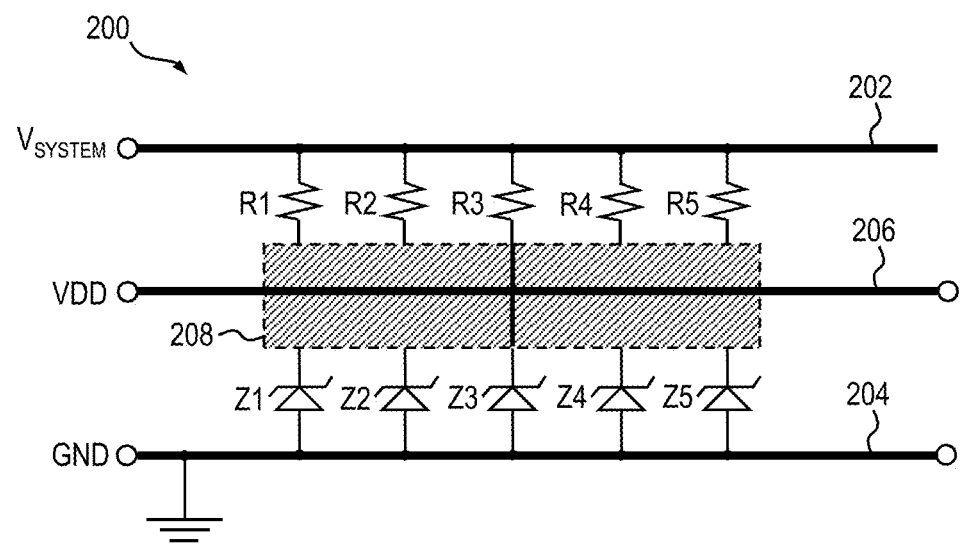

FIGS. 2A and 2B are schematic diagrams conceptually depicting at least a portion of exemplary voltage selection circuitry 200 integrated with an RFPA in a semiconductor device for adjusting an internal supply voltage of the RFPA to meet prescribed operating parameters based on an applied external system DC voltage source, before and after performing a voltage adjustment process, respectively, according to an embodiment of the invention. It is to be appreciated that when more than one amplifying stage is employed in the semiconductor device, a single common voltage selection circuit 200 may be used for providing the internal supply voltage to all, or at least a subset of stages, of the RFPA.

With reference now to FIG. 2A, the selection circuitry 200 comprises an array of resistors, R1, R2, R3, R4 and R5, and an array of Zener diodes, Z1, Z2, Z3, Z4 and Z5. Although only five resistors and five diodes are shown, it is to be appreciated that embodiments of the invention are not limited to any specific number of resistors or diodes; moreover, the number of resistors need not equal the number of diodes in the selection circuitry 200. Each of the resistors has a prescribed resistance value associated therewith which, in one or more embodiments, is preferably different than the other resistors in the array. Likewise, each of the Zener diodes has a prescribed Zener reverse breakdown voltage associated therewith which, in one or more embodiments, is preferably different than the other diodes in the array.

First terminals of the resistors R1-R5 are coupled with a common system voltage supply connection 202, which is connected with the applied external system DC voltage source, $V_{SYSTEM}$. Anode terminals of the Zener diodes Z1-Z5 are connected to a common voltage return connection 204 of the RFPA, which is connected to ground in this illustrative embodiment. Second terminals of the resistors R1-R5 are electrically coupled with an RFPA internal voltage supply connection 206, which is VDD in this illustrative embodiment, through a high-resistance material layer 208; each of the high-resistance connections between the resistors and VDD is depicted in FIG. 2A as an open circuit. Likewise, cathode terminals of the Zener diodes Z1-Z5 are electrically coupled with the internal voltage supply connection 206 through the high-resistance material layer 202; each of the high-resistance connections between the diodes and VDD is depicted in FIG. 2A as an open circuit.

In one or more embodiments, the high-resistance material layer 208 may be formed of amorphous silicon, or a deposited film or the like, whose resistivity is substantially high (e.g., greater than about 1-10 megohm-cm (MΩ-cm)) when initially deposited but can be significantly lowered (e.g., less than about 10 ohm-cm) by selectively annealing one or more portions of the material layer 208 as desired. Undoped polysilicon can be conductive due to crystal grain boundaries. The density of the grain boundaries is, in turn, determined by grain size which can be controlled by laser conditions. For example, a thickness of amorphous silicon film can range from about 25 to 500 nm, typically 50 nm. A thicker film results in lower resistance. In accordance with one or more embodiments of the invention, the resistance value between any given resistor and the RFPA internal voltage supply VDD, and likewise between any given Zener diode and VDD, is selectively lowered using a laser beam, electron beam or another controlled mechanism for annealing a specific portion(s) of the high-resistance material layer 208. The annealing process causes a phase change to occur in the high-resistance material layer 208 proximate the portion of the material layer directly exposed to the laser beam, thereby effectively forming a short circuit in the material layer defined by a path of the laser beam.

In one or more embodiments, to further reduce the resistivity of the resulting material, boron or phosphorus dopant can be added to the high-resistance material layer 208 by introducing a small amount of dopant gas during amorphous silicon film deposition. Dopant gases suitable for use with embodiments of the invention include, for example, borane ($BH_3$), diborane ($B_2H_6$) or phosphine ($PH_3$). The dopant can also be added by plasma doping; that is, the material layer 208 can be treated with $PH_3/N_2$ or $BH_3/N_2$ plasma, for example in situ at the end of the deposition process without breaking vacuum. The boron or phosphorus ion species generated in the plasma are accelerated by a plasma sheath voltage and implanted into the high-resistance material layer 208. After anneal, the resulting polycrystalline silicon resistivity ranges from about 5 to 0.005 ohm-cm after the dopant activation by the laser anneal.

With reference to FIG. 2B, the selection circuitry 200 is shown after an exemplary annealing process, wherein portions of the high-resistance material layer 208 are selectively annealed (e.g., using a laser or electron beam) to thereby form low-resistance electrical connections between the second terminal of resistor R3 and the RFA internal voltage supply VDD, and between the cathode terminal of Zener diode Z3 and VDD. By controlling the path of the laser or electron beam over the high-resistance material layer 208 during the annealing process, essentially any combination of electrical connections between the resistors R1-R5 and the RFPA internal voltage supply VDD, and between the Zener diodes Z1-Z5 and VDD can be achieved.

Figure 3A:
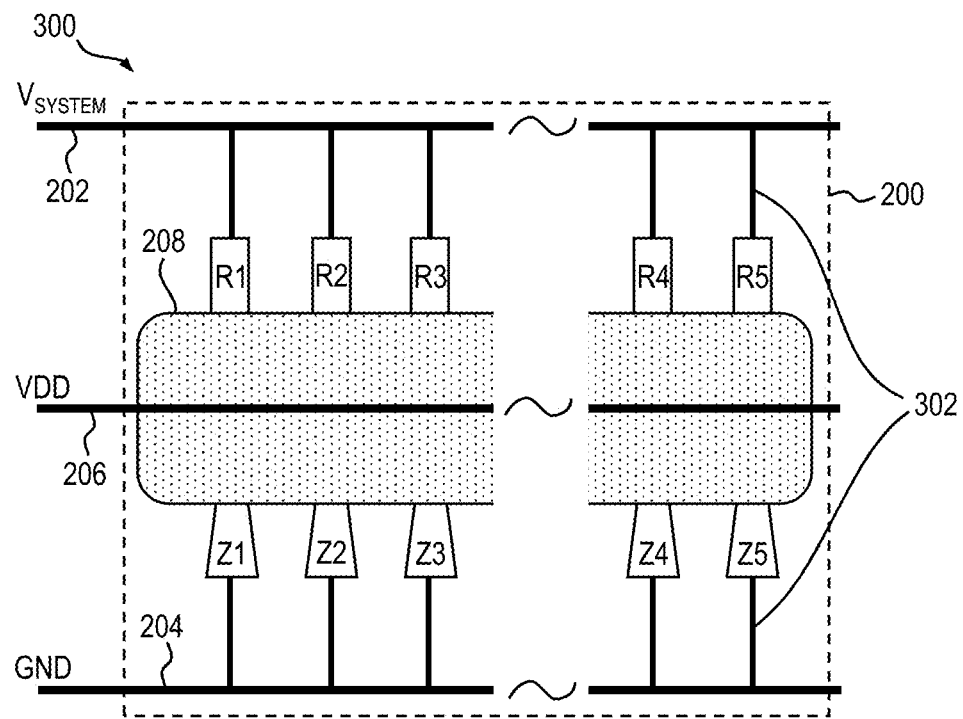
FIGS. 3A and 3B are top plan views conceptually depicting at least a portion of an exemplary semiconductor device having an array of resistors with various pre-determined resistance values and Zener diodes with various pre-determined reverse breakdown voltages, before and after the adjustment process for controlling an internal supply voltage of the device, respectively, according to an embodiment of the present invention.
Figure 3B:
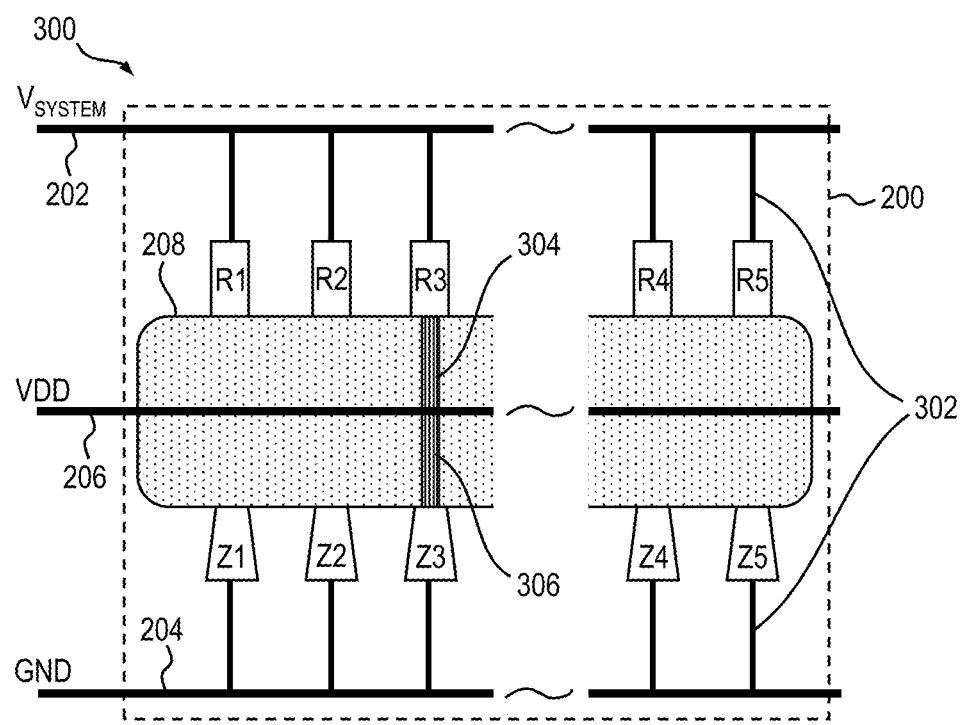

FIGS. 3A and 3B are top plan views conceptually depicting at least a portion of a semiconductor structure 300 including the exemplary selection circuitry 200 shown in FIGS. 2A and 2B having an array of resistors with different prescribed resistance values and Zener diodes with different prescribed Zener reverse breakdown voltages, according to an embodiment of the invention. FIG. 3A depicts the selection circuitry 200 before the adjustment process for controlling an internal supply voltage of the device, and FIG. 3B depicts the selection circuitry after the adjustment process.

With reference to FIGS. 3A and 3B, in one or more embodiments the system voltage supply connection 202, voltage return connection 204, and internal voltage supply (VDD) connection 206 are formed by conductive layers, such as a first metal (M1) interconnect layer, patterned and etched using standard metallization techniques known by those skilled in the art. Similarly, electrical connections 302 between first terminals of the resistors R1-R5 and the common system voltage supply connection 202, and between anode terminals of the Zener diodes Z1-Z5 and the common voltage return connection 204, are formed of one or more conductive layers (M1, M2, etc.) using standard interconnect processing techniques known by those skilled in the art.

The semiconductor structure 300 further includes a high-resistance material layer 208 which is in electrical contact with second terminals of the resistors R1-R5, cathode terminals of the Zener diodes Z1-Z5, and the internal voltage supply connection 206. In one or more embodiments, high-resistance material layer 208 comprises a thin film material (e.g., amorphous silicon) which has a substantially high resistivity when initially deposited, and hence effectively acts as an open circuit between the respective connected elements, but exhibits a significantly lowered resistivity when subjected to a targeted annealing process (e.g., using a laser or electron beam or the like), and thus effectively acts as a short circuit in selected areas of the deposited thin film material layer 208.

Optionally, in one or embodiments, the selection circuitry 200 includes a first bypass connection 304 coupled between the system voltage supply connection 202 and the high-resistance material layer 208, and a second bypass connection 306 coupled between the voltage return connection 204 and the high-resistance material layer. The first bypass connection 304 is used to electrically bypass the resistors R1 through R5 in the selection circuitry and the second bypass connection 306 is used to electrically bypass the Zener diodes Z1 through Z5 in selected connection configurations in which no resistors or diodes are required in the selection circuitry 200.

FIG. 3B depicts the semiconductor structure 300 after subjecting selected portions of the material to a laser or electron beam annealing process. A targeted annealing process (e.g., using a controlled laser or electron beam) causes a phase change in a first portion 308 of the thin film material layer 208 between the second terminal of resistor R3 and the internal voltage supply connection 206, and a second portion 310 of the thin film material layer between the cathode of Zener diode Z3 and the internal voltage supply connection, as shown in FIG. 3B. The first and second portions 308 and 310, respectively, have a substantially low resistivity, thereby forming electrical connections between respective terminals of resistor R3 and Zener diode Z3 and the internal voltage supply connection 206. Areas of the thin film material layer 208 not exposed to the annealing laser or electron beam remain at a high resistivity, such that there is effectively no electrical connection between the remaining resistors and Zener diodes in the selection circuitry 200 and the internal voltage supply connection 206.

In embodiments which include bypass connections 304, 306, an annealing laser or electron beam can be employed to selectively convert the portion of the high-resistance material layer 208 between the first bypass connection 304 and the internal voltage supply connection 206 to a low-resistance electrical short circuit, to thereby bypass the resistors in the selection circuitry 200. Similarly, the annealing laser or electron beam can be employed to selectively convert the portion of the high-resistance material layer 208 between the second bypass connection 306 and the internal voltage supply connection 206 to a low-resistance electrical short circuit, to thereby bypass the Zener diodes in the selection circuitry 200.

Figure 4A:
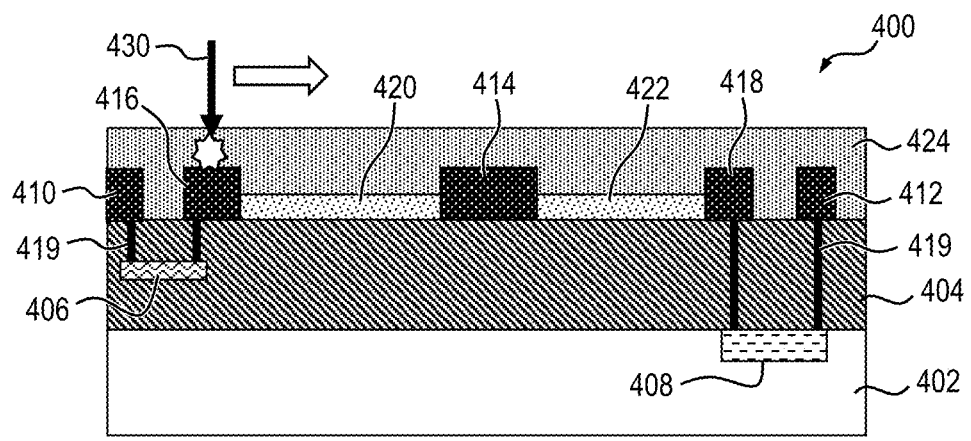
FIGS. 4A and 4B are cross-sectional and top plan views, respectively, depicting at least a portion of an exemplary semiconductor device before an adjustment process for adjusting an internal supply voltage of the device, according to an embodiment of the present invention.
Figure 4B:
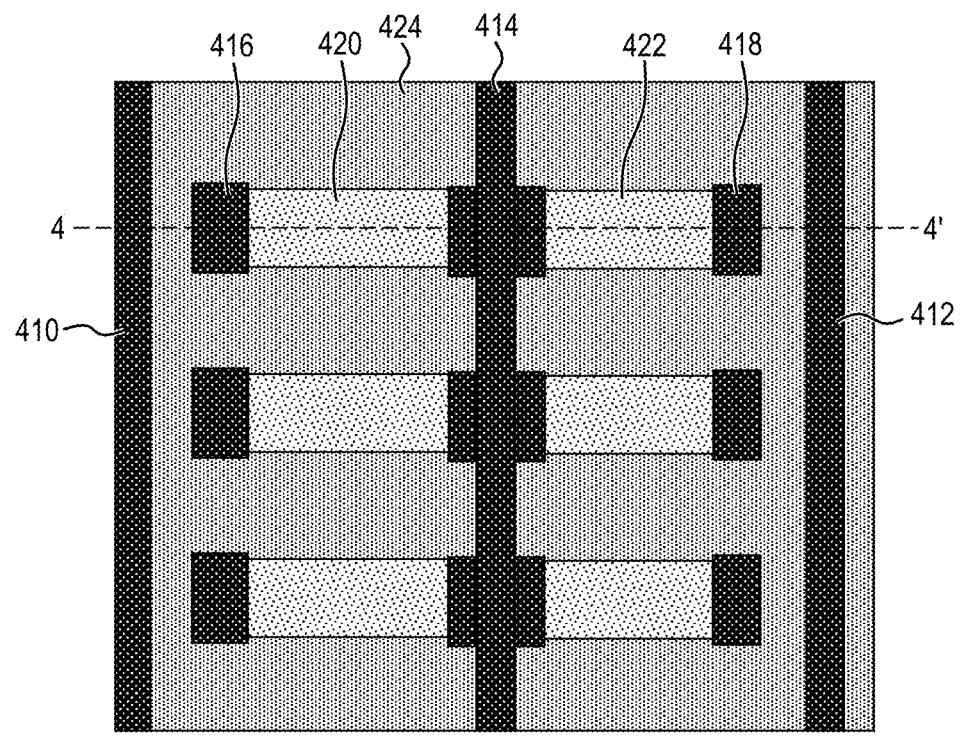

FIGS. 4A and 4B are cross-sectional and top plan views, respectively, depicting at least a portion of an exemplary layout of a semiconductor device 400 before an adjustment process for adjusting an internal supply voltage of the device, according to an embodiment of the invention; FIG. 4A is a cross section taken along line 4-4' in FIG. 4B. The semiconductor device 400 includes voltage selection circuitry comprising an array of resistors and an array of Zener diodes, preferably formed in a manner consistent with the exemplary voltage selection circuitry 200 shown in FIG. 2A. As part of a process for adjusting the internal supply voltage of the device, selective electrical connections are formed between an internal voltage supply (VDD) connection and corresponding elements (e.g., resistors and Zener diodes) in the voltage selection circuitry, as will be described in further detail below.

With reference to FIG. 4A, semiconductor device 400 includes a substrate 402 and an active device layer 404 formed on the substrate. The active layer 404 represents the layer in which semiconductor transistors, diodes, resistors, and other devices, and various layers of interconnect metals and dielectric layers (e.g., inter-metal dielectrics (IMD) and interlayer dielectrics (ILD)) are formed. The semiconductor device 400 includes a plurality of resistors formed in the active layer 404, of which resistor 406 is representative, and a plurality of Zener diodes formed in the substrate 402, of which Zener diode 408 is representative. Resistor 406 can be made either in the substrate 402 (such as using polysilicon) or in the active layer 404 (such as using tantalum nitride (TaN)). In one or more embodiments, each of at least a subset of the resistors 406 comprises polycrystalline silicon, although other materials, such as, for example, tantalum nitride, are similarly contemplated. Each of at least a subset of the Zener diodes 408 comprises a P-N junction, operated in its reverse breakdown region, which may be formed in the semiconductor device 400 in a conventional manner, as will be known by those skilled in the art.

A conductive (e.g., metal) layer is deposited on the active layer 404 and, through a patterning and etching process using standard metallization techniques known by those skilled in the art, various electrical connections are formed, including a system voltage supply connection 410 adapted to convey an external system voltage externally applied, a voltage return (ground) connection 412, and an internal voltage supply (VDD) connection 414, as well as conductive pads, 416 and 418, which provide electrical connection to the resistors 406 and Zener diodes 408, respectively.

Specifically, as previously described in conjunction with FIG. 3A, first terminals of the resistors 406 are connected to the system voltage supply connection 410, such as by using conductive vias 419 (e.g., through silicon vias (TSVs)) or the like formed through the active layer 404, and anode terminals of the Zener diodes 408 are connected to the voltage return connection 412, such as by using conductive vias. A second terminal of each resistor 406 is connected to a corresponding conductive pad 416, and a cathode terminal of each Zener diode 408 is connected to a corresponding conductive pad 418, such as by using respective conductive vias 419 formed through the active layer 404.

The semiconductor device 400 further comprises a high-resistance layer deposited on a portion of the active layer 404, such that a first portion 420 of the high-resistance layer is formed between the conductive pad 416 of a given resistor 406 and the internal voltage supply connection 414, and a second portion 422 of the high-resistance layer is formed between the cathode conductive pad 418 of a given Zener diode 408 and the internal voltage supply connection 414. The high-resistance layer 420, 422 may be formed of amorphous silicon, although other materials are similarly contemplated, such as, but not limited to, silicon germanium (SiGe) or a thin metal film (e.g., tungsten) that, at a selected thickness and/or composition range, presents a resistivity that can be lowered by orders of magnitude through laser or electron beam annealing. As previously explained, the high-resistance layer 420, 422 has a substantially high resistivity (e.g., 1-10 MΩ-cm or greater) when initially deposited, and thus acts as an open circuit between corresponding conductive pads 416, 418 and connections 414, but exhibits a significantly low resistivity (e.g., 10 Ω-cm or less), and thus acts as a short circuit, when subjected to a targeted annealing process which causes a phase change to occur in the material.

With continued reference to FIGS. 4A and 4B, a dielectric (i.e., insulating) layer 424 is formed on an upper surface of the semiconductor device 400, covering the metal connections (e.g., 410, 412, 414), conductive pads (e.g., 416, 418) and high-resistance layer 420, 422. A laser or electron beam 430 may be controllably scanned over the high-resistance layer 420, 422 along a prescribed path to thereby anneal a selected region in the high-resistance layer; the laser or electron beam and the semiconductor device are selectively movable in relation to one another. As a result of this annealing process, a region of low resistivity is formed in the exposed portion of the high-resistance layer 420, 422 which effectively acts as an electrical short circuit between selected conductive pads 416, 418 and the internal voltage supply connection 414. In one or more embodiments, the material forming the dielectric layer 424 comprises silicon oxide, silicon nitride or an alternative dielectric material that is transparent to the laser or electron beam 430. As an inert material, the dielectric layer 424 will not experience phase change resulting from the scanning, and therefore remains effective as a passivation layer, protecting the semiconductor device 400 from the ambient environment (e.g., moisture, oxygen, etc.).

One or more characteristics of the laser or electron beam 430, such as, for example, beam intensity (i.e., energy), beam width and scanning rate (i.e., beam duration/exposure), can be selectively adjusted in order to control the resistivity of the final materials resulting from the high-resistance layer 420, 422. For example, a resistance of the resulting connection between the internal voltage supply connection 414 and a corresponding conductive pad 416, 418 will be proportional to the beam width of the laser or electron beam 430; that is, as the beam width increases, the conductivity of the connection path formed in the high-resistance layer increases.

By way of example only and without limitation, the laser beam 430 can be an ultraviolet (UV) krypton fluoride (KrF) excimer laser with a wavelength of 248 nanometers (nm), or a xenon monochloride (XeCl) excimer laser of 308 nm. The laser beam 430 can also be a continuous wave green laser or an infrared femtosecond titanium-sapphire laser of 800 nm with a pulse duration in a range of about 50-125 femtoseconds (fs). The laser fluence for anneal usually ranges from about 50 to 1000 mJ/cm$^2$, that produces polycrystalline silicon grain size of about 1 to 200 μm. The optical path of the laser beam 430 can be fixed with the wafer moving by a stepper. Alternatively, the laser beam 430 can be scanned with a galvo mirror system or the like. The irradiation at each location can be a single laser pulse or multiple pulse. Usually, the grain sizes of the crystallized amorphous silicon films initially increases, and then saturates with increased laser pulses.

Figure 5A:
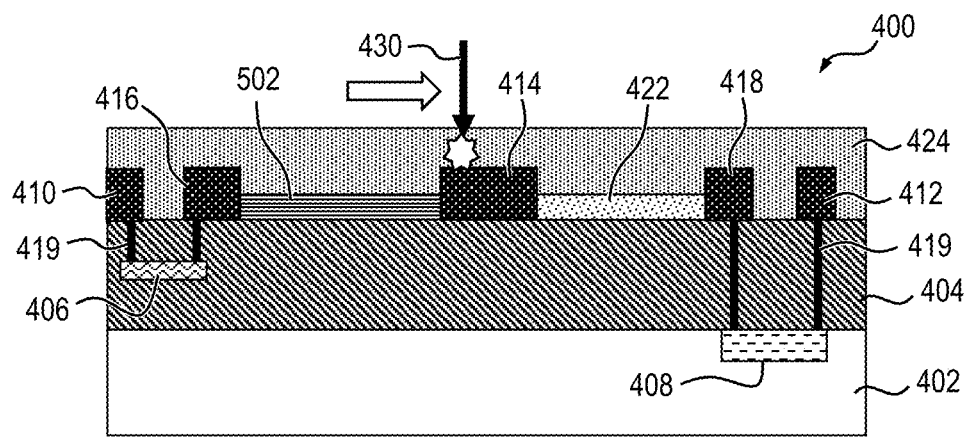
FIGS. 5A and 5B are cross-sectional and top plan views, respectively, depicting at least a portion of the exemplary semiconductor device shown in FIGS. 4A and 4B after laser or electron beam annealing has been performed for forming selected electrical connections in voltage selection circuitry of the device, according to an embodiment of the present invention.
Figure 5B:
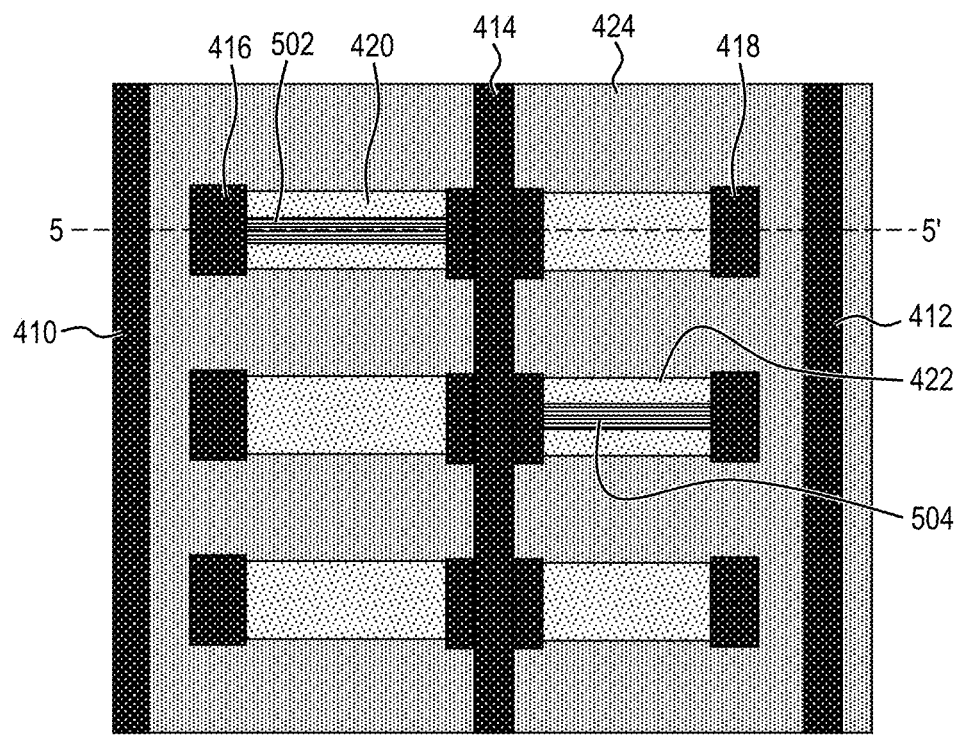

FIGS. 5A and 5B are cross-sectional and top plan views, respectively, depicting at least a portion of the exemplary semiconductor device 400 shown in FIGS. 4A and 4B after the laser or electron beam annealing process has been performed for forming selected electrical connections in the voltage selection circuitry of the device, according to an embodiment of the invention; FIG. 5A is a cross section taken along line 5-5' in FIG. 5B. In FIG. 4A, the laser or electron beam 430 is positioned on the conductive pad 416 of a given resistor 406 at a start of the annealing process. As shown in FIGS. 5A and 5B, the laser or electron beam 430 has been scanned over the high-resistance layer 420 and is positioned on the internal voltage supply connection 414 to create a conductive region 502 through the high-resistance layer 420 which electrically connects the resistor to the internal voltage supply connection. It is to be appreciated that the amount of energy needed to anneal the high-resistance layer 420, 422 is significantly less than that required to remove metal, and therefore although the laser or electron beam 430 may make contact with the conductive pad 416, 418 or internal voltage supply connection 414, it will not compromise the integrity of those conductive structures.

Once the laser or electron beam 430 reaches the pad or connection on the opposite end of the high-resistance layer corresponding to a given circuit element, the annealing process is complete for that element. At that point, the laser or electron beam 430 is repositioned to a different region in the high-resistance material layer or, if no further electrical connections need to be created, the annealing process ends.

With reference to FIG. 5B, two electrical connections are formed, 502 and 504, using the laser or electron beam annealing process for connecting a resistor 406 and a Zener diode 408 to the internal voltage supply connection 414, respectively. In this illustrative embodiment, the laser or electron beam width, and hence a width of each of the connections 502, 504, is less than a width of the high-resistance layer 420, 422 in which the connections are formed. Alternatively, FIGS. 6A, 6B, 7A and 7B depict an illustrative embodiment wherein the width of the high-resistance layer, in which the electrical connections between corresponding circuit elements and the internal voltage supply connection are selectively formed, is less than or equal to a width of the laser or electron beam.

Figure 6A:
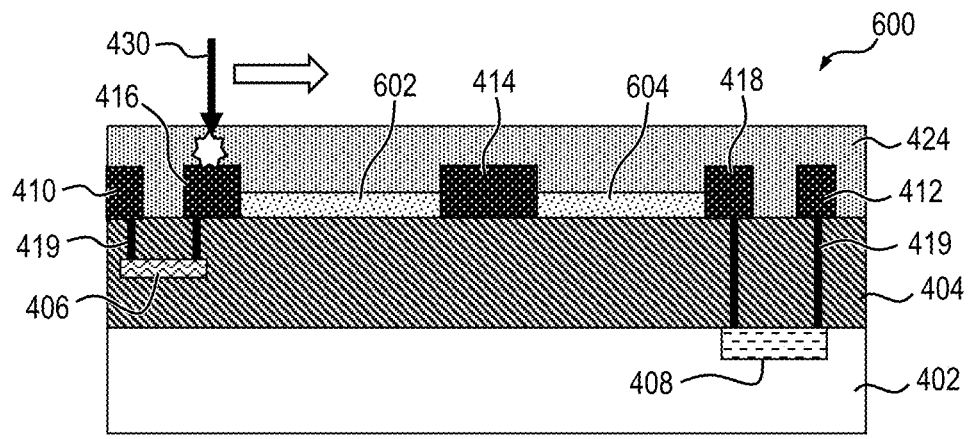
FIGS. 6A and 6B are cross-sectional and top plan views, respectively, depicting at least a portion of an exemplary semiconductor device before an adjustment process for adjusting an internal supply voltage of the device, wherein a high-resistance layer in the device has a width that is less than or equal to a width of a laser or electron beam used to perform an annealing process, according to an embodiment of the present invention.
Figure 6B:
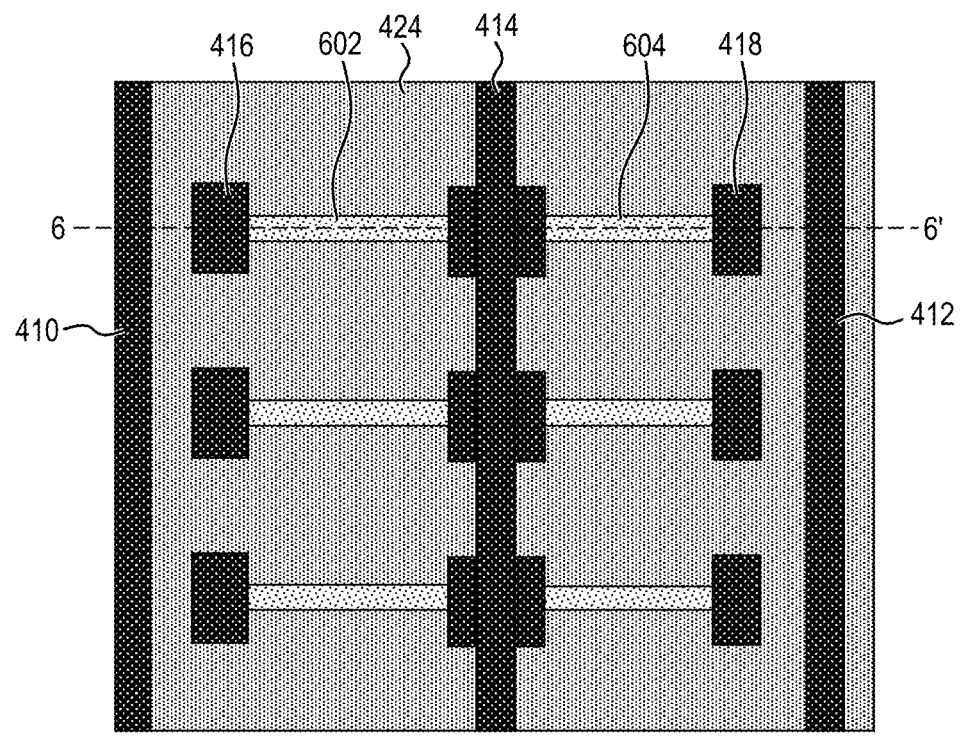
Figure 7A:
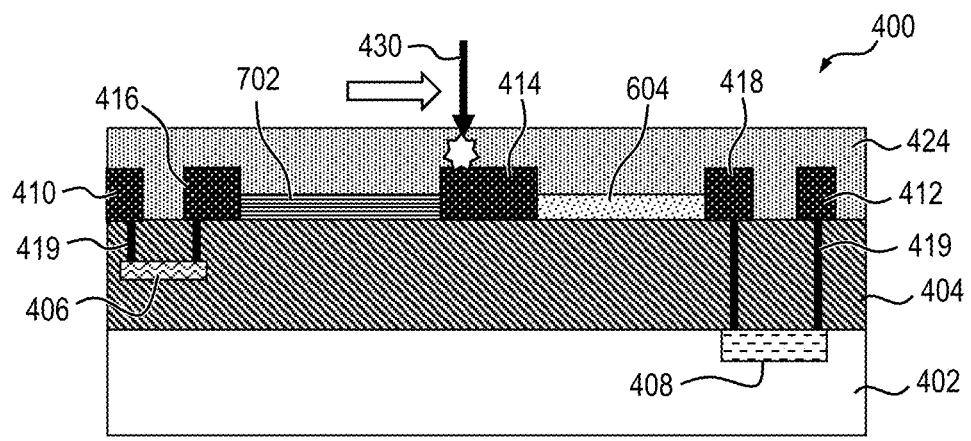
FIGS. 7A and 7B are cross-sectional and top plan views, respectively, depicting at least a portion of the exemplary semiconductor device shown in FIGS. 6A and 6B after the laser or electron beam annealing process has been performed for forming selected electrical connections in the voltage selection circuitry of the device, according to an embodiment of the present invention.
Figure 7B:
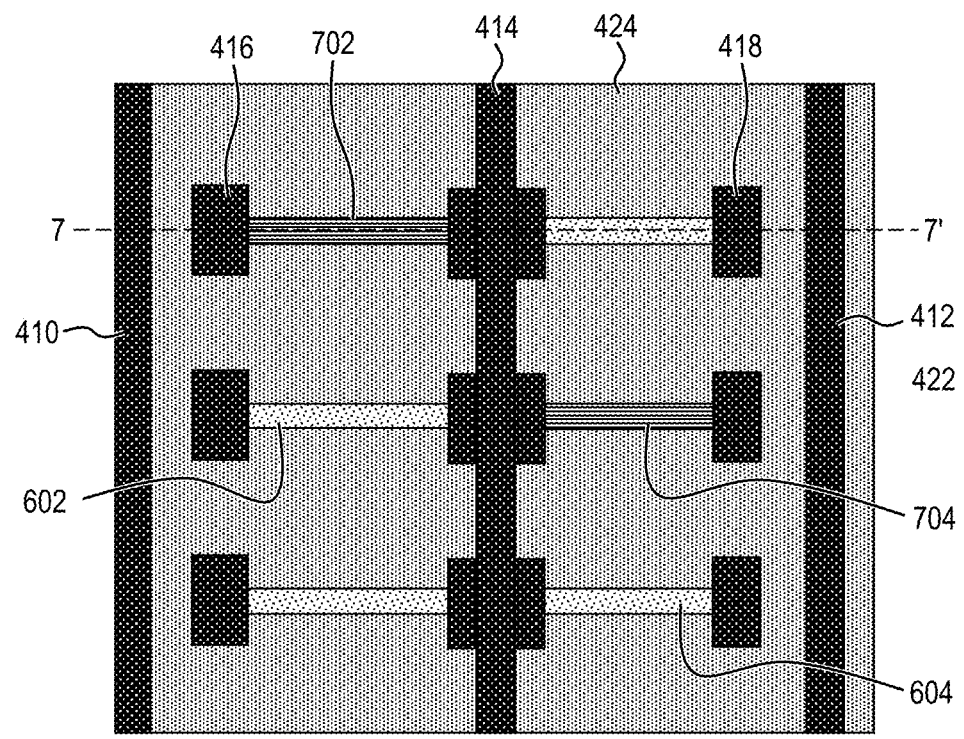

More particularly, FIGS. 6A and 6B are cross-sectional and top plan views, respectively, depicting at least a portion of an exemplary semiconductor device 600 before an adjustment process for adjusting an internal supply voltage of the device, according to an embodiment of the invention, and FIGS. 7A and 7B are cross-sectional and top plan views, respectively, depicting at least a portion of the exemplary semiconductor device 600 shown in FIGS. 6A and 6B after the laser or electron beam annealing process has been performed for forming selected electrical connections in voltage selection circuitry of the device, according to an embodiment of the invention; FIG. 6A is a cross section taken along line 6-6' in FIG. 6B, and FIG. 7A is a cross section taken along line 7-7' in FIG. 7B. FIGS. 6A through 7B are consistent with FIGS. 4A through 5B, except that a width of the high-resistance layers 602 and 604 in the semiconductor device 600 are configured to be less than or equal to a width of the laser or electron beam 430. In this embodiment, an entirety of the high-resistance material is converted to a low-resistivity connection after laser or electron beam annealing, as depicted more clearly in the top plan view of FIG. 7B.

Figure 8A:
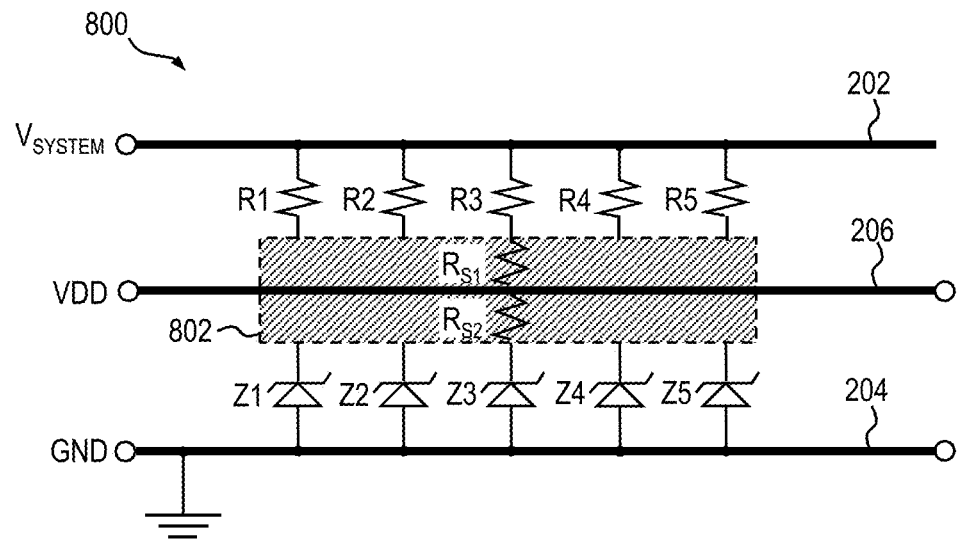
FIGS. 8A and 8B are schematic diagrams conceptually depicting at least a portion of two different illustrative configurations of selection circuitry in a semiconductor device after an adjustment process for adjusting the internal supply voltage of the device, according to embodiments of the present invention.
Figure 8B:
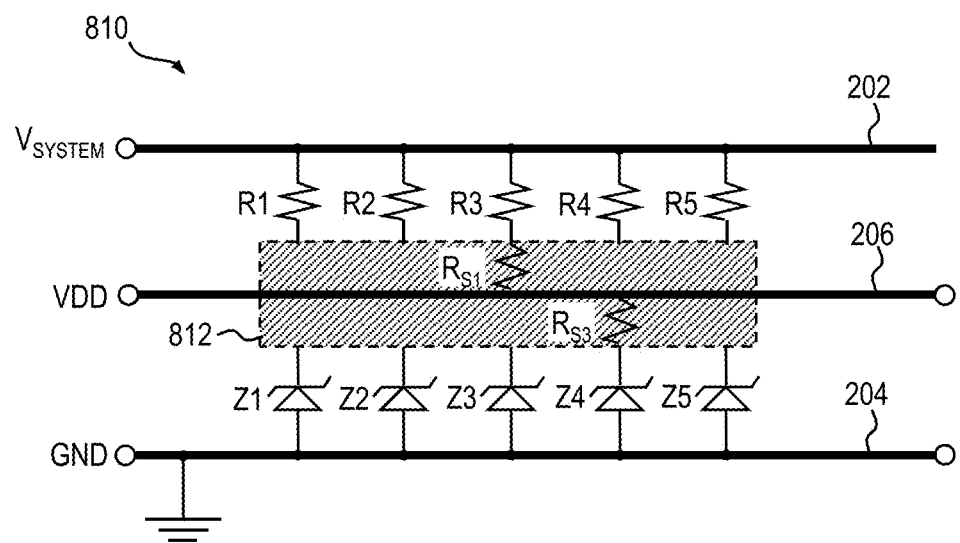

FIGS. 8A and 8B are schematic diagrams conceptually depicting at least a portion of two different illustrative configurations of selection circuitry for integration with an RFPA in a semiconductor device for adjusting an internal supply voltage of the RFPA, after an adjustment process for adjusting the internal supply voltage of the device, according to embodiments of the invention. It is to be understood that embodiments of the invention are not limited to any particular numbers or combinations of circuit elements in the selection circuitry.

With reference to FIG. 8A, exemplary selection circuitry 800 includes an array of resistors, R1 through R5, and an array of Zener diodes, Z1 through Z5. Although only five resistors and five diodes are shown, it is to be understood that embodiments of the invention are not limited to any specific number of resistors or diodes; moreover, the number of resistors and diodes need not equal one another. Each of the resistors has a prescribed resistance value associated therewith which, in one or more embodiments, is preferably different than the other resistors in the array. Likewise, each of the Zener diodes has a prescribed Zener reverse breakdown voltage associated therewith which, in one or more embodiments, is preferably different than the other diodes in the array.

Like the selection circuitry shown in FIG. 2B, first terminals of the resistors R1-R5 are coupled with the common system voltage supply connection 202, which is connected with the applied external system DC voltage source, $V_{SYSTEM}$. Anode terminals of the Zener diodes Z1-Z5 are connected to the common voltage return connection 204 of the RFPA, which is connected to ground in this illustrative embodiment. Second terminals of the resistors R1-R5 are electrically coupled with the RFPA internal voltage supply connection 206, which is VDD in this illustrative embodiment, through a high-resistance material layer 802; each of the high-resistance connections between the resistors and VDD that have not been subjected to laser or electron beam annealing is depicted in FIG. 8A as an open circuit. Likewise, cathode terminals of the Zener diodes Z1-Z5 are electrically coupled with the internal voltage supply connection 206 through the high-resistance material layer 802; again, each of the high-resistance connections between the diodes and VDD that have not been subjected to laser or electron beam annealing is depicted in FIG. 8A as an open circuit.

In the exemplary embodiment shown in FIG. 8A, the second terminal of resistor R3 is electrically connected to the internal voltage supply connection 206 through a low-resistance connection formed by laser or electron beam annealing of a corresponding selected region in the high-resistance layer 802, in a manner previously described. This connection will have some finite resistance represented by series resistor $R_{S1}$. Likewise, the cathode of Zener diode Z3 is electrically connected to the internal voltage supply connection 206 through a low-resistance connection formed by laser or electron beam annealing of a corresponding selected region in the high-resistance layer 802. This connection will have some finite resistance represented by series resistor $R_{S2}$.

With reference now to FIG. 8B, exemplary selection circuitry 810 is shown which is essentially the same as the selection circuitry 800 depicted in FIG. 8A, except that the selection circuitry 810 includes an low-resistance electrical connection between the cathode of Zener diode Z4 and the internal voltage supply connection 206, as represented by series resistor $R_{S3}$, and the cathode of Zener diode Z3 remains open (i.e., unconnected). This circuit configuration demonstrates that the connection between a given resistor and the internal voltage supply connection 206 need not be aligned with the connection between a given Zener diode and the internal voltage supply connection; that is, connections between the one or more resistors and the internal voltage supply connection and connections between the one or more Zener diodes and the internal voltage supply connection are independent of one another.

Embodiments of illustrative voltage selection circuitry shown in FIGS. 2A through 8B have essentially all involve forming electrical connections between circuit elements and the internal voltage supply connection where only high-resistance (i.e., open circuit) connections initially exist. In this scheme, a laser or electron beam is used to anneal selected regions of a high-resistance material layer to thereby change the phase of the material from a high-resistivity phase (i.e., open circuit) to a low-resistivity phase (i.e., short circuit). As an alternative voltage adjustment scheme, embodiments of the invention similarly contemplate removing electrical connections between circuit elements and the internal voltage supply connection where such elements are all initially connected. In this scheme, a laser or electron beam is preferably used to selectively cut metal connections using an ablation process (e.g., laser ablation) thereby creating an open circuit.

Figure 9A:
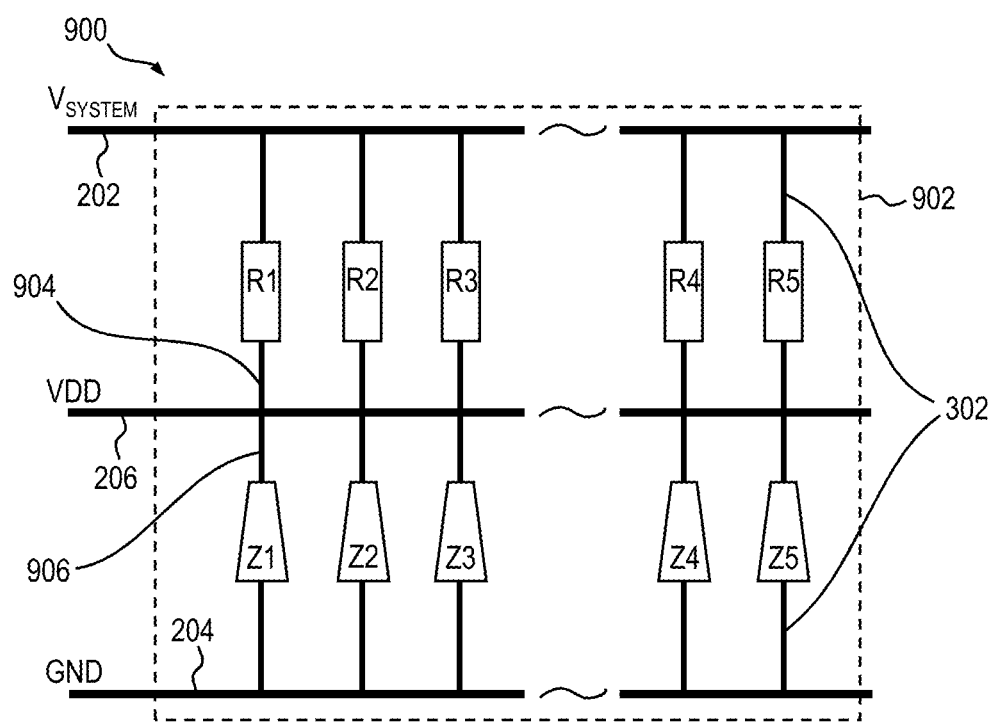
FIGS. 9A and 9B are top plan views conceptually depicting at least a portion of an exemplary semiconductor device having an array of resistors with various pre-determined resistance values and Zener diodes with various pre-determined reverse breakdown voltages, before and after an alternative adjustment process for adjusting the internal supply voltage of the device, respectively, according to an embodiment of the present invention.
Figure 9B:
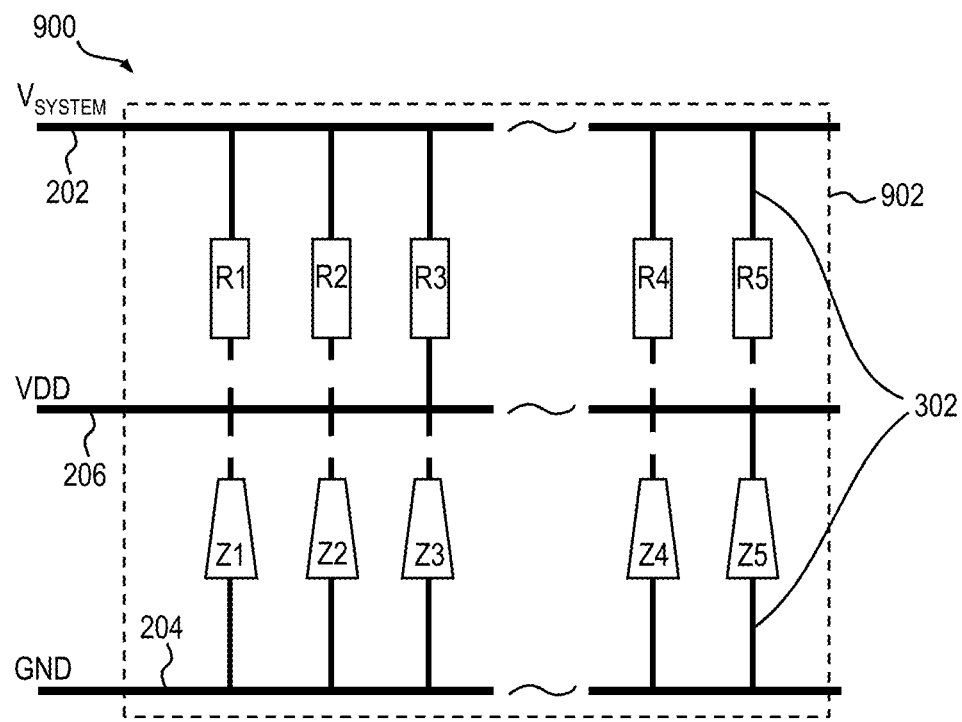

FIGS. 9A and 9B are top plan views conceptually depicting at least a portion of an exemplary semiconductor device 900 including voltage selection circuitry 902 having an array of resistors with various pre-determined resistance values and Zener diodes with various pre-determined reverse breakdown voltages, before and after an alternative adjustment process for adjusting the internal supply voltage of the device, respectively, according to an embodiment of the invention. Like the semiconductor device 300 shown in FIG. 3A, the semiconductor device 900 in one or more embodiments includes the system voltage supply connection 202, the voltage return connection 204, and the internal voltage supply (VDD) connection 206, which may be formed by conductive layers, such as a first metal (M1) interconnect layer, patterned and etched using standard metallization techniques known by those skilled in the art. Similarly, in the voltage selection circuitry 902, in one or more embodiments, electrical connections 302 between first terminals of the resistors R1-R5 and the common system voltage supply connection 202, and between anode terminals of the Zener diodes Z1-Z5 and the common voltage return connection 204, are formed of one or more conductive layers (M1, M2, etc.) using standard interconnect processing techniques known by those skilled in the art.

As shown in FIG. 9A, rather than having second terminals of the resistors and cathode terminals of the Zener diodes disconnected from the internal voltage supply connection 206 (e.g., in the selection circuitry 200 shown in FIG. 3A), second terminals of each of the resistors R1-R5 in the selection circuitry 902 are all initially connected to the internal voltage supply connection 206 using corresponding conductors (i.e., conductive links) 904 during wafer processing. Likewise, cathode terminals of each of the Zener diodes Z1-Z5 are initially connected to the internal voltage supply connection 206 using corresponding conductors 906 during wafer processing. In one or more embodiments, the conductors 904, 906 are formed of metal, such as, for example, aluminum or another suitable metal having a low melting point.

Optionally, in one or embodiments, the selection circuitry 902 includes a first bypass connection 908 coupled between the system voltage supply connection 202 and the internal voltage supply connection 206, and a second bypass connection 910 coupled between the voltage return connection 204 and the internal voltage supply connection. The first bypass connection 908 is used to electrically bypass the resistors R1 through R5 in the selection circuitry, and the second bypass connection 910 is used to electrically bypass the Zener diodes Z1 through Z5 in selected connection configurations in which no resistors or diodes are required in the selection circuitry 902.

As part of the voltage adjustment mechanism, selected conductors 904, 906 in the voltage selection circuitry 902 are subjected to laser ablation to effectively remove at least a portion of the conductors, thus resulting in open circuits being created. In the example shown in FIG. 9B, conductors 904 between resistors R1, R2, R4 and R5 have been removed, leaving only resistor R3 electrically connected to the internal voltage supply connection 206. Likewise, conductors 906 between Zener diodes Z1, Z2, Z3 and Z4 have been removed, leaving only Zener diode Z5 connected to the internal voltage supply connection 206.

In embodiments which include bypass connections 908, 910, the default configuration is that the resistors and diodes are shorted out using the bypass connections. For configurations that require at least one resistor, the first bypass connection 908 is electrically open-circuited, such as by using an annealing laser or electron beam, or an alternative energy source so that there is no direct connection between the system voltage supply connection 202 and the internal voltage supply connection 206, other than through selected resistors. Likewise, for configurations that require at least one Zener diode, the second bypass connection 910 is electrically open-circuited so that there is no direct connection between the voltage return connection 204 and the internal voltage supply connection 206, other than through selected Zener diodes.

Figure 10A:
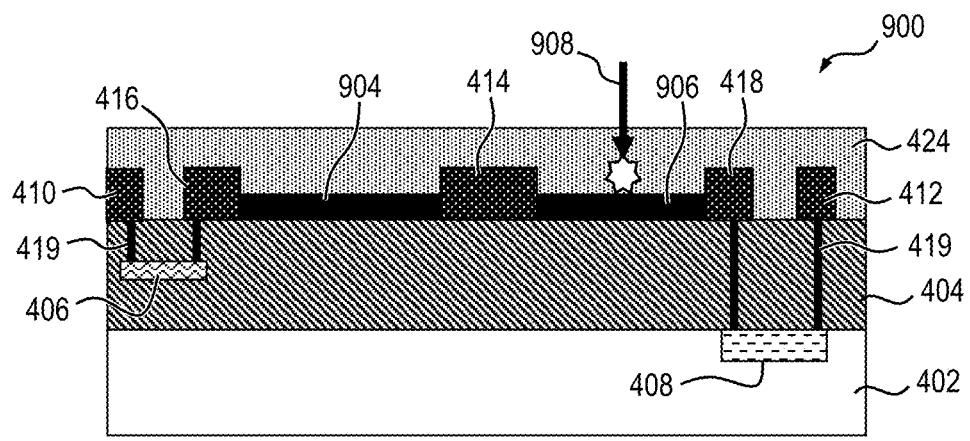
FIGS. 10A and 10B are cross-sectional and top plan views, respectively, depicting at least a portion of an exemplary semiconductor device before an alternative adjustment process for adjusting the internal supply voltage of the device, according to an embodiment of the present invention.
Figure 10B:
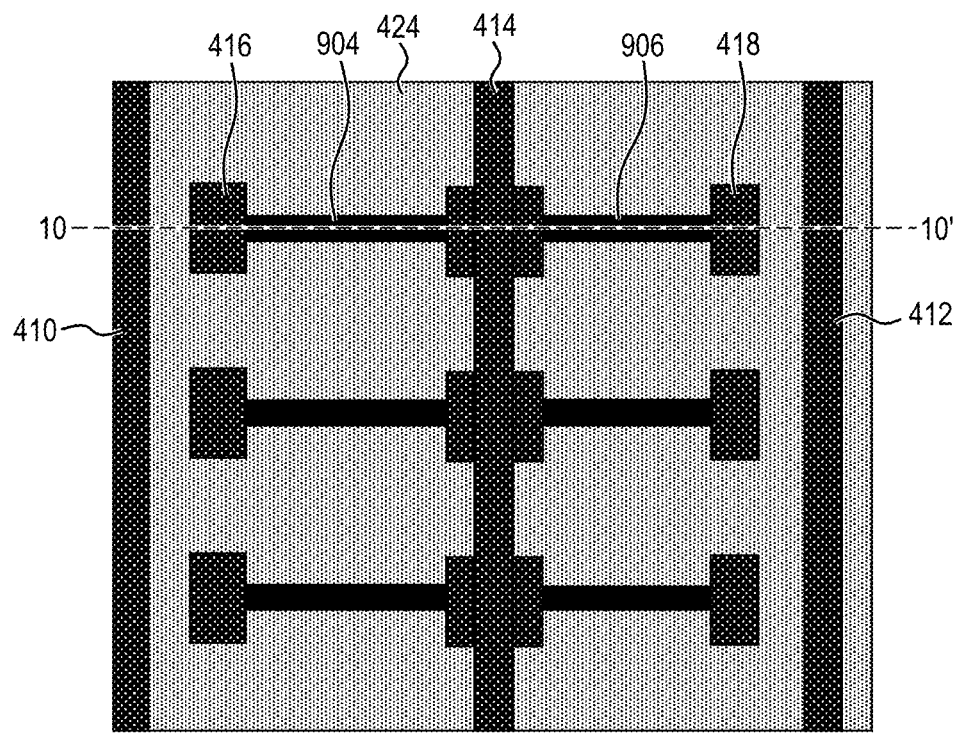
Figure 11A:
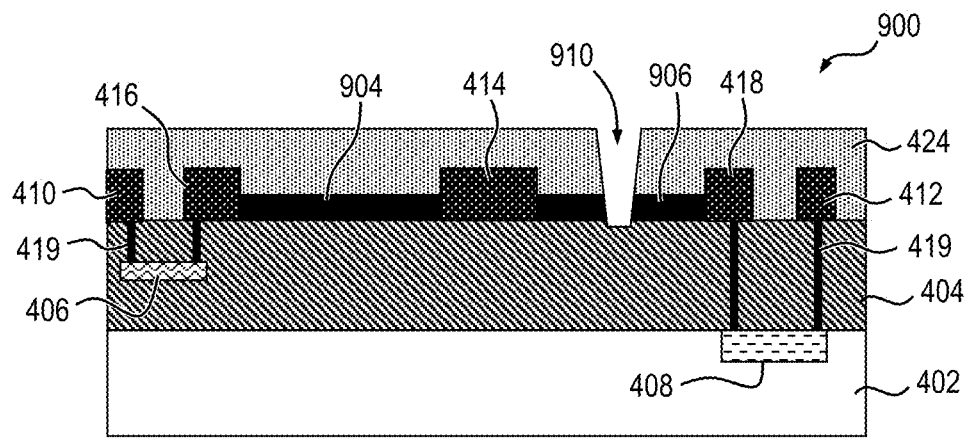
FIGS. 11A and 11B are cross-sectional and top plan views, respectively, depicting at least a portion of an exemplary semiconductor device after the alternative adjustment process for adjusting the internal supply voltage of the device, according to an embodiment of the present invention.
Figure 11B:
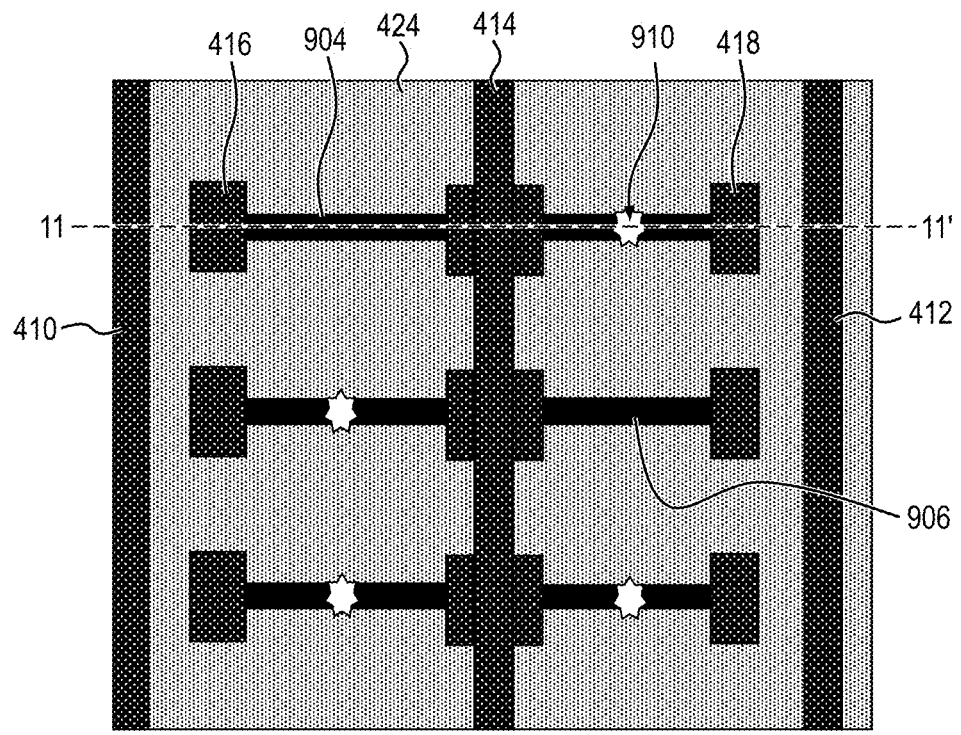

FIGS. 10A and 10B are cross-sectional and top plan views, respectively, depicting at least a portion of the exemplary semiconductor device 900 shown in FIG. 9A before performing a laser or electron beam ablation process for adjusting an internal supply voltage of the device, according to an embodiment of the invention, and FIGS. 11A and 11B are cross-sectional and top plan views, respectively, depicting at least a portion of the exemplary semiconductor device 900 after the laser or electron beam ablation process has been performed for removing selected electrical connections in voltage selection circuitry 902 of the device, according to an embodiment of the invention; FIG. 10A is a cross section taken along line 10-10' in FIG. 10B, and FIG. 11A is a cross section taken along line 11-11' in FIG. 11B.

FIG. 10A illustrates at least a portion of the exemplary semiconductor device 900 shown in FIG. 9A. The semiconductor device 900 is preferably formed in a manner consistent with the semiconductor device 400 shown in FIG. 4A. Specifically, the semiconductor device 900 includes substrate 402 and active device layer 404 formed on the substrate. The semiconductor device 900 includes a plurality of resistors formed in the substrate or active layer 402 or 404, respectively, of which resistor 406 is representative, and a plurality of Zener diodes formed in the substrate 402, of which Zener diode 408 is representative. Each of at least a subset of the resistors 406 preferably comprises polycrystalline silicon (formed in the substrate 402), although other materials (e.g., tantalum nitride formed in the active layer 404) are similarly contemplated. Each of at least a subset of the Zener diodes 408 comprises a P-N junction with a different reverse breakdown voltage relative to one or more of the other Zener diodes, operated in its reverse breakdown region, which may be formed in the semiconductor device 900 in a conventional manner, as will be known by those skilled in the art.

In one or more embodiments, the system voltage supply connection 410, adapted to convey the external system voltage externally applied, the voltage return (ground) connection 412, and the internal voltage supply (VDD) connection 414, as well as conductive pads, 416 and 418, which provide electrical connection to the resistors 406 and Zener diodes 408, respectively, are formed on the active layer 404 using standard metallization techniques, as will be known to those skilled in the art. First terminals of the resistors 406 are connected to the system voltage supply connection 410, such as by using conductive vias 419 (e.g., through silicon vias (TSVs)) or the like formed through the active layer 404, and anode terminals of the Zener diodes 408 are connected to the voltage return connection 412, such as by using conductive vias. A second terminal of each resistor 406 is connected to a corresponding conductive pad 416, and a cathode terminal of each Zener diode 408 is connected to a corresponding conductive pad 418, such as by using respective conductive vias 419 formed through the active layer 404.

Conductors 904, which may be formed using a standard metallization process (e.g., M1 metallization), disposed between corresponding resistor pads 416 and the internal voltage supply connection 414, initially provide electrical connection between the respective resistor elements (e.g., R1-R5 in FIG. 9A) and the internal voltage supply connection. Similarly, connectors 906, which may be formed using a standard metallization technique, disposed between corresponding Zener diode cathode pads 418 and the internal voltage supply connection 414, initially provide electrical connection between the respective Zener diode elements (e.g., Z1-Z5 in FIG. 9A) and the internal voltage supply connection.

With reference to FIG. 10A, a laser or electron beam 1002 is used, in one or more embodiments, as an energy source for ablating selected conductors 904, 906 to form open circuits. The laser or electron beam 1002 is preferably positioned over or proximate to a center of a given conductor 904, 906 to be removed. In one or more embodiments, a width of the conductor 904, 906 is narrow (e.g., about 1-3 μm), preferably narrower than a width of the laser or electron beam 1002, such that the conductor can be ablated without repositioning (i.e., scanning) the laser. Alternatively, if the conductor 904, 906 is wider than the width of the laser or electron beam 1002, the laser or electron beam is preferably scanned across the surface of the conductor, orthogonally to its major axis, in order to completely remove the conductor and thereby form an open circuit.

The ablation process typically involves removing material from a solid surface (e.g., metal) by irradiating the material with a laser or electron beam, or alternative energy source. At low laser flux, the material is heated by the absorbed laser energy causing the exposed material to evaporate or sublimate. At high laser flux, the material is typically converted to a plasma. Usually, a pulsed laser is used to remove the material due to its higher peak intensity, however it is possible to ablate the material with a continuous wave (CW) laser beam if the laser intensity is sufficiently high. Compared to the energy required for the annealing process, the energy required for laser ablation is substantially higher. Consequently, the laser or electron beam 1002 will be different from the laser or electron beam 430 shown in FIG. 4A, at least in terms of wavelength, CW or pulse duration and beam energy (i.e., flux).

FIGS. 11A and 11B depict at least a portion of the exemplary semiconductor device 900 after the laser or electron beam ablation process has been performed for removing selected electrical connections in the voltage selection circuitry 902 of the device, as previously stated. With reference to FIG. 11A, the laser or electron beam is used to form an opening 1102 through the dielectric passivation layer 424 and through the conductor 906 to expose an upper surface of the active layer 404. As illustrated in the top plan view of FIG. 11B, the opening 1102 formed through the conductor 906 is configured to completely cut the conductor thereby creating an open circuit between the corresponding Zener diode and the internal voltage supply connection 414. After performing the laser ablation process on a given selected conductor 904, 906, the laser beam is repositioned over another selected conductor and the process is repeated until no further conductors are to be ablated. At this point, the internal voltage adjustment procedure is complete.

Figure 12A:
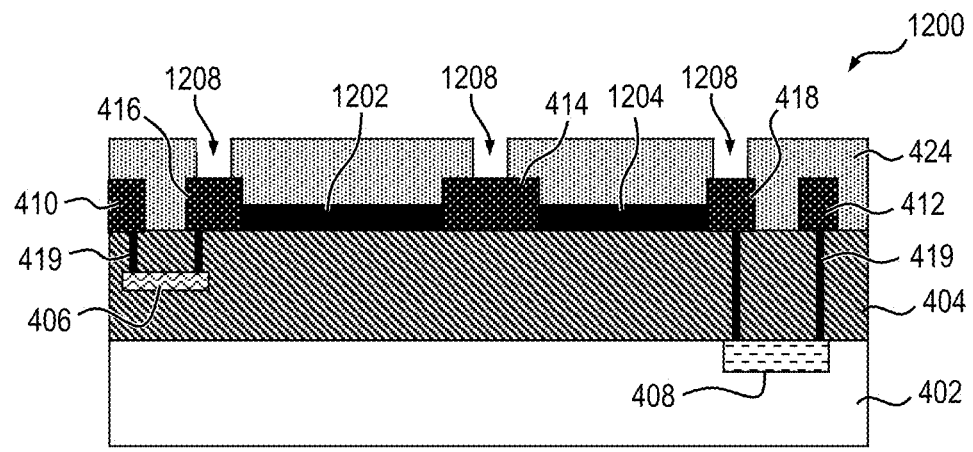
FIGS. 12A and 12B are cross-sectional and top plan views, respectively, depicting at least a portion of an exemplary semiconductor device before an alternative adjustment process for adjusting the internal supply voltage of the device that includes the formation of openings through a passivation layer to exposes conductive pads connected to corresponding resistors and Zener diodes in the device, according to an embodiment of the present invention.
Figure 12B:
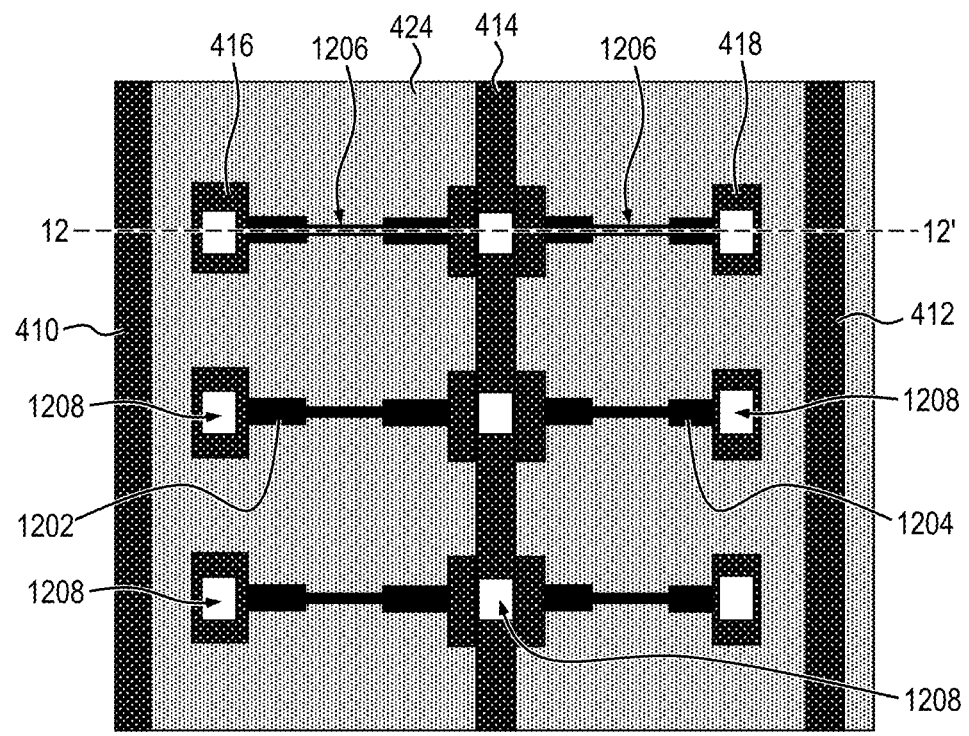

FIGS. 12A and 12B are cross-sectional and top plan views, respectively, depicting at least a portion of an exemplary semiconductor device 1200 before an alternative adjustment process for adjusting the internal supply voltage of the device, according to an alternative embodiment of the invention; FIG. 12A is a cross section taken along line 12-12' in FIG. 12B. In a manner similar to the removal of selected electrical connections as shown in FIGS. 10A through 11B, this illustrative embodiment involves the targeted application of an external energy source to create an open circuit for removing selected electrical connections in the voltage selection circuitry (902 in FIG. 9A) of the device 1200.

Rather than using a laser or electron beam to supply the energy for ablation, however, an array of probes (see FIGS. 13A and 13B) is used to apply a prescribed voltage or current (e.g., pulsed current) to burn off a portion of a selected metal conductor connecting two probes, similar to a fuse link. To accomplish this, the semiconductor device 1200, in one or more embodiments, includes voltage selection circuitry formed in a manner consistent with the voltage selection circuitry 902 shown in FIGS. 10A through 11B, except that each of a first plurality of conductive links 1202, which may be resistor conductive links, providing electrical connection between the respective resistors 406 and the internal voltage supply connection 414, and each of a second plurality of conductive links 1204, which may be diode conductive links, providing electrical connection between the respective Zener diodes 408 and the internal voltage supply connection, have a narrowed (i.e., thinned) region 1206 along a length of its major axis. For example, in one or more embodiments, the conductors 1202, 1204 are shaped as a dog bone, although embodiments of the invention are not limited to any specific shape(s) or dimension(s).

The narrowed region 1206 of a given conductive link 1202, 1204 creates a weak site in the conductive link (i.e., a break point) which causes breakage at the prescribed location when a current is passed through the link, since a resistance in the narrowed region is significantly higher relative to other portions of the conductive link. Specifically, when the current forced through a selected conductive link 1202, 1204 is sufficiently high (e.g., about 100-200 milliamperes (mA)), heat generated in the narrowed region 1206 of the link will burn off (i.e., ablate) the material (e.g., metal) creating an open circuit in the conductive link.

The narrowed region 1206 of the conductive link beneficially reduces the amount of energy required to blow the link thereby forming an open circuit. The dimensions (e.g., length, width and cross-sectional thickness) of the narrowed region 1206 are preferably configured such that once ablated, the blown link will not reform an electrical connection but will remain an open circuit. Moreover, the conductive links are configured to provide a reliable short circuit connection when desired; that is, a given conductive link 1204, 1206 will not unintentionally form an open circuit during the course of normal operation.

In one or more embodiments, a plurality of openings 1208 are formed through the dielectric passivation layer 424 to expose at least a portion of the underlying conductive pads 416 and 418, connected to corresponding resistors 406 and Zener diodes 408, respectively, and the internal voltage supply connection 414 in order to provide electrical access thereto. The openings 1208, in one or more embodiments, may be formed using an etching process such as, for example, plasma etching (e.g., reactive ion etching (RIE)), wet etching (e.g., anisotropic wet etching), dry etching, etc.

Figure 13A:
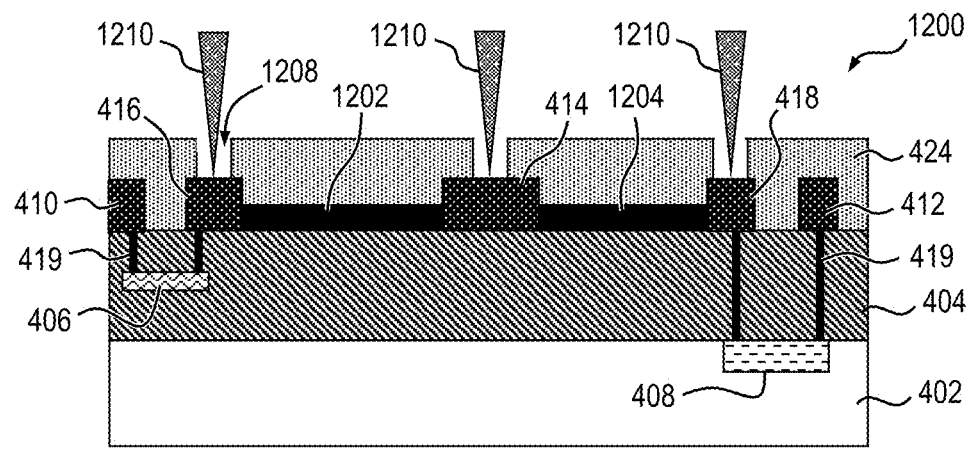
FIGS. 13A and 13B are cross-sectional and top plan views, respectively, depicting at least a portion of an exemplary semiconductor device before the alternative adjustment process shown in FIGS. 12A and 12B for adjusting the internal supply voltage of the device that includes the targeted application of an external voltage or current using conductive probes, according to an embodiment of the present invention.
Figure 13B:
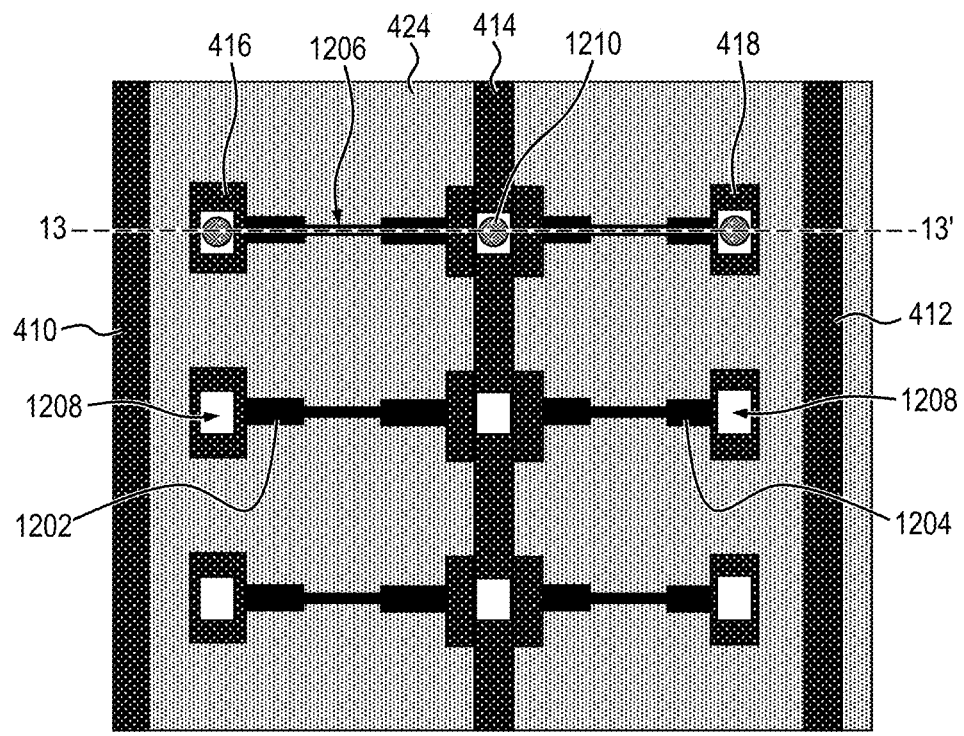

FIGS. 13A and 13B are cross-sectional and top plan views, respectively, depicting at least a portion of the exemplary semiconductor device 1200 before the alternative adjustment process of FIGS. 12A and 12B for adjusting the internal supply voltage of the device that shows using conductive probes for selectively applying an external voltage or current, according to an embodiment of the present invention; FIG. 13A is a cross section taken along line 13-13' in FIG. 13B. As shown in FIGS. 13A and 13B, a plurality of conductive probes 1210 are employed. The probes 1210 are appropriately shaped and sized so as to pass through the openings 1208 and are adapted to make electrical contact with the corresponding underlying conductive pads 416, 418 and internal voltage supply connection 414.

Figure 14A:
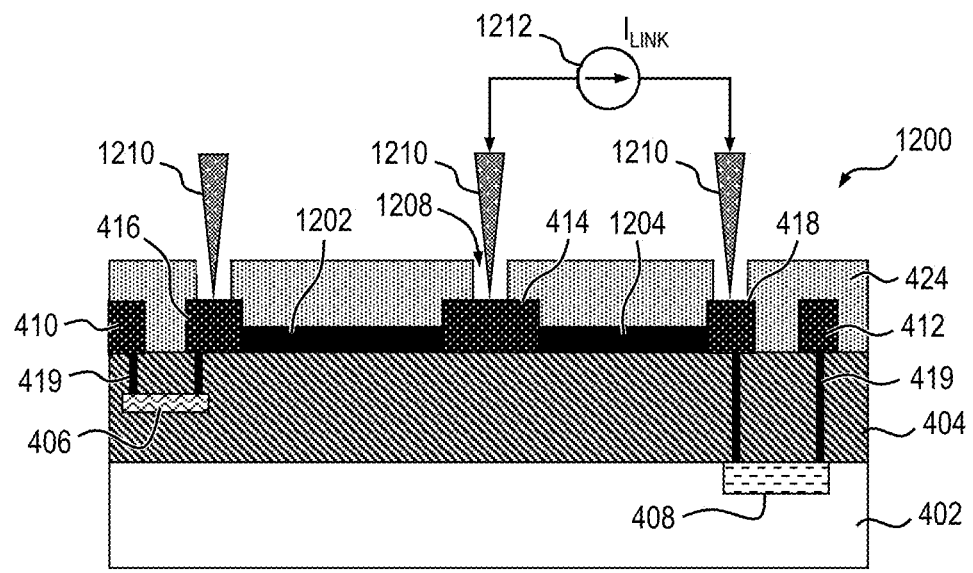
FIGS. 14A and 14B are cross-sectional and top plan views, respectively, depicting at least a portion of the exemplary semiconductor device shown in FIGS. 13A through 13B after the alternative adjustment process for adjusting the internal supply voltage of the device, according to an embodiment of the present invention.
Figure 14B:
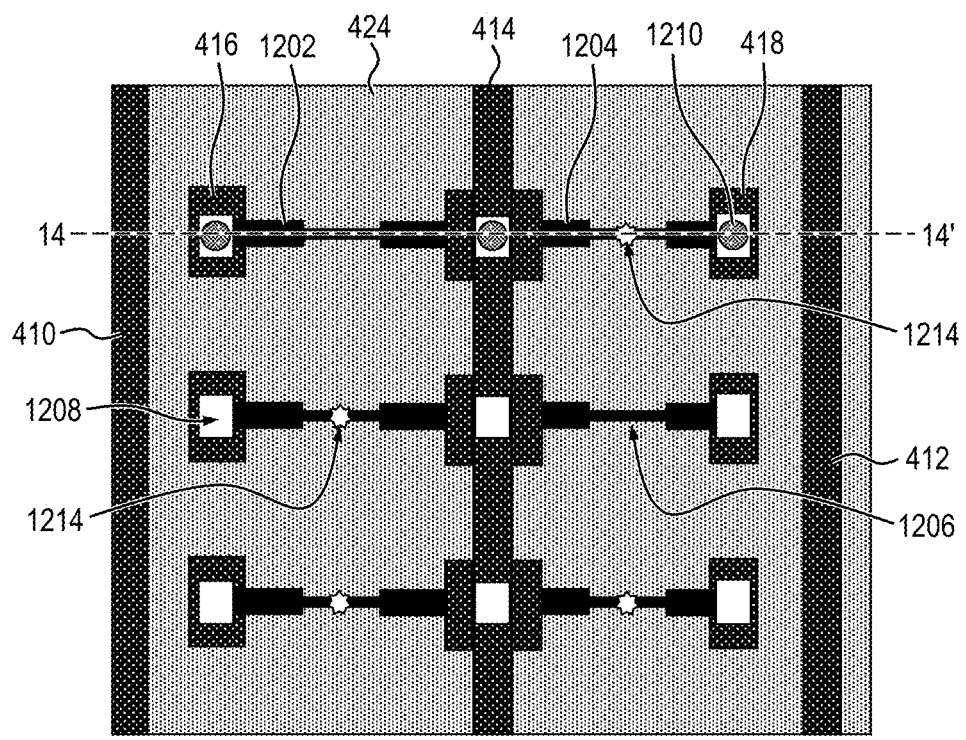

FIGS. 14A and 14B are cross-sectional and top plan views, respectively, depicting at least a portion of the exemplary semiconductor device 1200 shown in FIGS. 13A through 13B after the alternative adjustment process for adjusting the internal supply voltage of the device, according to an embodiment of the present invention; FIG. 14A is a cross section taken along line 14-14' in FIG. 14B. With reference to FIGS. 14A and 14B, in order to form an open circuit in a given conductive link, a current source 1212 is applied across two probes 1210 which are positioned, through openings 1208 in the dielectric layer 424, so as to make electrical contact with the underlying internal voltage supply connection 414 and a conductive pad 418 of a corresponding conductive link 1204 to be broken by way of voids formed by forced electromigration. A current, LINK, generated by the current source 1212 is preferably sufficiently high enough to break the selected conductive link 1204.

The direction of the current $I_{LINK}$ is not important, but rather the heat generated in the conductive link will primarily be a function of a magnitude of the current. Upon application of a sufficiently high current, the narrowed region 1206 of a selected conductive link 1204, 1206 will undergo severe electromigration (i.e., atoms are moved along the current flow direction), thereby forming voids in the conductive material sufficient to create an open circuit 1214 in the selected link. This process is repeated for each desired blown link by repositioning the probes 1210 across another desired link to blow and then applying a current.

FIG. 15 is a table 1500 showing exemplary combinations of resistor and Zener diode values in the selection circuitry of the semiconductor device for achieving certain internal supply voltage levels as a function of different external system supply voltages, according to one or more embodiments of the invention. More particularly, table 1500 includes exemplary configurations of Zener diodes and resistors based on the externally applied system DC voltage source, $V_{SYSTEM}$, assuming a typical load power of about 3.5 watts. The column "Zener Selection" represents the desired Zener voltage rating, and the column "R" represents the ideal resistor value.

One or more embodiments of the invention utilize selectable links (e.g., 904, 906 in FIG. 10A) included in the voltage selection circuitry (e.g., 902 in FIG. 9A) having an array of resistors with various prescribed resistance values and Zener diodes with various prescribed reverse breakdown voltages, to connect at least one desired Zener diode and at least one desired resistor into the final configured circuit to thereby achieve desired RF performance and power efficiency parameters. For certain configurations, such as a 10- or 12-volt applied external system DC voltage source $V_{SYSTEM}$, no Zener diodes or resistors are needed in the voltage selection circuitry; the external system DC voltage source $V_{SYSTEM}$ can be directly connected to VDD to enable optimal RFPA efficiency. Such configurations, however, require the power transistor used in the RFPA to be able to withstand the VDD values which requires sophisticated semiconductor device design and engineering.

Specifically, by way of illustration only and without limitation, with reference to FIG. 15, row 1502 in table 1500 indicates that for an externally applied system voltage $V_{SYSTEM}$ of 8 volts and a desired internal voltage supply VDD of 8 volts, and assuming any load power requirement, no Zener diodes or resistors (i.e., VDD connected directly to $V_{SYSTEM}$) are needed in the voltage selection circuitry to achieve a power efficiency of about 100 percent. In this scenario, resistor and Zener diode bypass connections (e.g., 304, 306 in FIG. 3A, or 908, 910 in FIG. 9A). In row 1504, for an applied $V_{SYSTEM}$ of 10 volts, a desired VDD of 10 volts, and any load power requirement, no Zener diodes or resistors are selected—that is, Zener diodes and resistors are bypassed using the respective bypass connections to achieve a power efficiency of about 100 percent. In row 1506, for an applied $V_{SYSTEM}$ of 12 volts, a desired VDD of 10 volts, and a load power requirement of 1 watt, a 10 volt Zener diode and a 20 ohm resistor are selected to achieve a power efficiency of about 83 percent. In row 1508, for an applied $V_{SYSTEM}$ of 12 volts, a desired VDD of 10 volts, and a load power requirement of 3.5 watts, a combination of a 10 volt Zener diode and a 5.6 ohm resistor are selected to achieve a power efficiency of about 83 percent. In row 1510, for an applied $V_{SYSTEM}$ of 12 volts, a desired VDD of 12 volts, and any load power requirement, no Zener diodes or resistors are selected—that is, $V_{SYSTEM}$ is directly connected to VDD without any resistor or Zener diode—to achieve a power efficiency of about 100 percent.

Similarly, in row 1512, for an applied $V_{SYSTEM}$ of 15 volts, a desired VDD of 12 volts, and a load power requirement of 1 watt, a combination of a 12 volt Zener diode and a 36 ohm resistor are selected to achieve a power efficiency of about 80 percent. In row 1514, for an applied $V_{SYSTEM}$ of 15 volts, a desired VDD of 12 volts, and a load power requirement of 3.5 watts, a combination of a 12 volt Zener diode and a 10 ohm resistor are selected to achieve a power efficiency of about 80 percent. In row 1516, for an applied $V_{SYSTEM}$ of 19 volts, a desired VDD of 15 volts, and a load power requirement of 1 watt, a 15 volt Zener diode and a 60 ohm resistor are selected to achieve a power efficiency of about 79 percent. In row 1518, for an applied $V_{SYSTEM}$ of 19 volts, a desired VDD of 15 volts, and a load power requirement of 3.5 watts, a combination of a 15 volt Zener diode and a 17.1 ohm resistor are selected to achieve a power efficiency of about 79 percent. In row 1520, for an applied $V_{SYSTEM}$ of 20 volts, a desired VDD of 15 volts, and a load power requirement of 3.5 watts, a 15 volt Zener diode and a 20.8 ohm resistor are selected to achieve a power efficiency of about 75 percent. In row 1522, for an applied $V_{SYSTEM}$ of 20 volts, a desired VDD of 18 volts, and a load power requirement of 3.5 watts, a combination of an 18 volt Zener diode and a 10.3 ohm resistor are selected to achieve a power efficiency of about 90 percent. Although several combinations of Zener diode voltages and resistor values are shown for achieving various desired internal VDD supply voltages as a function of several different applied system voltage levels, it is to be appreciated that embodiments of the invention are not limited to any specific combinations of Zener diode voltages and resistor values.

For a more general case, the following expression can be used to determine an optimal resistance selection, R, in the voltage selection circuitry:

$$R = \frac{(V_{SYSTEM} - VDD) \cdot VDD}{P_{LOAD}}, \quad (1)$$

where $V_{SYSTEM}$ is the input system voltage applied to the voltage selection circuitry (e.g., via common system voltage supply connection 202 shown in FIG. 2A), VDD is the desired internal supply voltage (e.g., output on internal voltage supply connection 206 in FIG. 2A), and $P_{LOAD}$ is the desired load power. As shown in FIGS. 8A and 8B, taking into account the finite resistance, $R_{S1}$, of a corresponding laser-formed link, expression (1) above becomes:

$$R = \frac{(V_{SYSTEM} - VDD) \cdot VDD}{P_{LOAD}} - R_{S1} \quad (2)$$

The Zener diode selection will ideally have a reverse breakdown voltage equal to the desired internal supply voltage VDD. Percent power efficiency, E, can be determined using the following expression:

$$E = \left(1 - \frac{V_{SYSTEM} - VDD}{V_{SYSTEM}}\right) \cdot 100 \quad (3)$$

Given the discussion thus far, it will be appreciated that an exemplary monolithic semiconductor device according to an embodiment of the present invention includes at least one RFPA circuit and a voltage supply adjustment network coupled with the RFPA circuit for providing an internal supply voltage to the RFPA circuit based on an input voltage applied to the device. The voltage supply adjustment network includes multiple resistors, multiple Zener diodes, a voltage return connection, an internal supply voltage connection coupled with the RFPA circuit for conveying the supply voltage to the RFPA circuit, an input voltage connection adapted to receive the input voltage, and a configurable connection network coupled with the resistors and Zener diodes. A subset of the resistors and Zener diodes is selectively connected together between the input voltage and the voltage return connections via corresponding conductive links to provide a prescribed output voltage to the internal supply voltage connection as a function of the applied input voltage. The connection network is configured by application of an energy source to one or more selected conductive links in the connection network.

At least a portion of the techniques of the present invention may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as integrated circuits. One skilled in the art would know how to dice wafers and package dies to produce integrated circuits. Any of the exemplary circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from voltage regulation and/or voltage conversion, in accordance with one or more embodiments of the invention.

An integrated circuit in accordance with aspects of the present disclosure can be employed in essentially any application and/or electronic system where high-frequency signal amplification is desired. This novel architecture can be used to eliminate the need for a DC-DC converter and associated components, which advantageously reduces the required space, circuit complexity, power consumption and cost of the system, among other important benefits. Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "upper," "lower," "front" and "back," where used, are intended to indicate relative positioning of elements or structures to each other when such elements are oriented in a particular manner, as opposed to defining absolute positioning of the elements.

The corresponding structures, materials, acts, and equivalents of all means or step-plus-function elements in the claims below, as may be used, are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus, the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments shown and described herein, and that various other changes and modifications are made therein by one skilled in the art without departing from the scope of the appended claims.

What is claimed is:

1. A semiconductor device, comprising:
   at least one radio frequency (RF) power amplifier; and
   a voltage supply adjustment network coupled to the at least one RF power amplifier for providing an internal supply voltage to the at least one RF power amplifier based on an input voltage applied to the semiconductor device, the voltage supply adjustment network comprising:
   a plurality of resistors;
   a plurality of Zener diodes;
   a voltage return connection coupled to a voltage return of the at least one RF power amplifier;
   an internal supply voltage connection coupled to the at least one RF power amplifier for conveying the internal supply voltage to the RF power amplifier;
   an input voltage connection adapted to receive the input voltage; and
   a configurable connection network coupled to the resistors and Zener diodes, a subset of the resistors and Zener diodes being selectively connected together between the input voltage connection and the voltage return connection via corresponding conductive links to provide a prescribed output voltage to the internal supply voltage connection as a function of the applied input voltage, the configurable connection network being configured by application of an energy source to one or more selected conductive links in the connection network.

2. The semiconductor device of claim 1, wherein the configurable connection network further comprises at least one of a first bypass connection selectively coupled between the input voltage connection and the internal supply voltage connection, and a second bypass connection selectively coupled between the voltage return connection and the internal supply voltage connection, the first and second bypass connections electrically bypassing the plurality of resistors and the plurality of Zener diodes in the voltage supply adjustment network.

3. The semiconductor device of claim 1, wherein the configurable connection network further comprises a high-resistance material layer connected between the plurality of resistors and the internal supply voltage connection and between the plurality of Zener diodes and the internal supply voltage connection, the high-resistance material layer having a first resistivity when in a first state and having a second resistivity when in a second state, the first resistivity being substantially higher than the second resistivity.

4. The semiconductor device of claim 3, wherein when exposed to a targeted energy source, a selected region in the high-resistance material layer changes from the first state to the second state to thereby form a low-resistance conductive path through the high-resistance material layer.

5. The semiconductor device of claim 4, wherein the targeted energy source is one of a laser beam and an electron beam.

6. The semiconductor device of claim 5, wherein the laser beam or electron beam and the semiconductor device are selectively movable in relation to one another.

7. The semiconductor device of claim 3, wherein the high-resistance material layer comprises a phase-change material.

8. The semiconductor device of claim 3, wherein the high-resistance material layer comprises one of amorphous silicon and a deposited film.

9. The semiconductor device of claim 3, wherein the high-resistance material layer comprises a dopant introduced during deposition of the high-resistance material layer.

10. The semiconductor device of claim 9, wherein the dopant comprises one of boron and phosphorus.

11. The semiconductor device of claim 3, wherein a first terminal of each of the plurality of resistors is connected to the input voltage connection, an anode of each of the plurality of Zener diodes is connected to the voltage return connection, a second terminal of each of the plurality of resistors and a cathode terminal of each of the plurality of Zener diodes are connected to the high-resistance material layer, and wherein when exposed to a targeted energy source, at least one selected region in the high-resistance material layer changes from the first state to the second state to thereby form a corresponding low-resistance conductive path through the high-resistance material layer, each conductive path electrically connecting one of the plurality of resistors or one of the plurality of Zener diodes to the internal supply voltage connection.

12. The semiconductor device of claim 1, wherein a first terminal of each of the plurality of resistors is connected to the input voltage connection, an anode of each of the plurality of Zener diodes is connected to the voltage return connection, a second terminal of each of the plurality of resistors is connected to the internal supply voltage connection via a corresponding first plurality of conductive links, and a cathode of each of the plurality of Zener diodes is connected to the internal supply voltage connection via a corresponding second plurality of the conductive links, and wherein selected ones of the first and second plurality of conductive links are open-circuited to adjust a voltage level of output voltage provided to the internal supply voltage connection.

13. The semiconductor device of claim 12, wherein the selected ones of the first and second plurality of conductive links are open-circuited by laser or electron beam ablation.

14. The semiconductor device of claim 12, wherein each of at least a subset of the first and second plurality of conductive links includes a narrowed region along a length of its major axis, and wherein a given one of the first and second plurality of conductive links is open-circuited by passing a prescribed current through the given one of the first and second plurality of conductive links.

15. The semiconductor device of claim 1, wherein the voltage supply adjustment network further comprises:
   a first plurality of conductive links providing electrical connection between the respective plurality of resistors and the internal voltage supply connection;
   a second plurality of conductive links providing electrical connection between the respective plurality of Zener diodes and the internal voltage supply connection;
   a plurality of conductive pads providing electrical connection to the respective plurality of resistors and the plurality of Zener diodes;
   a dielectric layer formed on an upper surface of the semiconductor device covering the first and second plurality of conductive links, the conductive pads and the internal voltage supply connection; and
   a plurality of openings formed through the dielectric layer to expose at least a portion of the underlying conductive pads and a portion of the internal voltage supply connection proximate an end of each of the conductive links, each of the openings being configured to receive a conductive probe for passing a prescribed current through selected conductive links to thereby cause an open circuit to be formed in the selected conductive links.

16. The semiconductor device of claim 1, wherein at least one of the plurality of Zener diodes is selected to have a reverse breakdown voltage that is about equal to a supply voltage level required by the RF power amplifier, and wherein at least one of the plurality of resistors is selected according to an expression:

$$R = \frac{(V_{SYSTEM} - VDD) \cdot VDD}{P_{LOAD}} - R_{S1},$$

where R represents a total resistance of the selected at least one of the plurality of resistors, $V_{SYSTEM}$ represents the applied input voltage, VDD represents the supply voltage level required by the RF power amplifier, $R_{S1}$ represents a resistance of a corresponding connection link formed by laser or electron beam treatment, and $P_{LOAD}$ represents a load power of the RF power amplifier.

17. The semiconductor device of claim 1, wherein the at least one RF power amplifier comprises a plurality of amplifying stages, and wherein the internal supply voltage provided by the voltage supply adjustment network is shared by at least a subset of the plurality of amplifying stages via the internal supply voltage connection.

* * * * *

UNITED STATES PATENT AND TRADEMARK OFFICE
CERTIFICATE OF CORRECTION

PATENT NO. : 10,826,434 B2  
APPLICATION NO. : 16/373172  
DATED : November 3, 2020  
INVENTOR(S) : Yi Zheng and Xiaotong Lin Page 1 of 1

It is certified that error appears in the above-identified patent and that said Letters Patent is hereby corrected as shown below:

In the Specification

Column 4, Line 42:  
Now reads "to exposes"  
Should read --to expose--

Column 10, Line 11:  
Now reads "one or embodiments"  
Should read --one or more embodiments--

Signed and Sealed this  
Twenty-ninth Day of June, 2021

Drew Hirshfeld  
*Performing the Functions and Duties of the*  
*Under Secretary of Commerce for Intellectual Property and*  
*Director of the United States Patent and Trademark Office*